(12) United States Patent
Iwasa

(10) Patent No.: US 9,606,007 B2
(45) Date of Patent: Mar. 28, 2017

(54) SEMICONDUCTOR DEVICE AND MEASUREMENT METHOD

(71) Applicant: LAPIS SEMICONDUCTOR CO., LTD., Kanagawa (JP)

(72) Inventor: Yosuke Iwasa, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 399 days.

(21) Appl. No.: 14/222,114

(22) Filed: Mar. 21, 2014

(65) Prior Publication Data
US 2014/0286472 A1 Sep. 25, 2014

(30) Foreign Application Priority Data
Mar. 25, 2013 (JP) .................. 2013-062609

(51) Int. Cl.
*G01K 7/20* (2006.01)
*G01R 23/00* (2006.01)

(52) U.S. Cl.
CPC ............ *G01K 7/203* (2013.01); *G01R 23/005* (2013.01)

(58) Field of Classification Search
CPC ....... G01K 7/203; G01K 7/245; G01R 23/005
See application file for complete search history.

(56) References Cited

U.S. PATENT DOCUMENTS

| | | | | | |
|---|---|---|---|---|---|
| 3,537,002 | A | * | 10/1970 | Lambert | ................... G01P 3/60 324/161 |
| 4,150,573 | A | * | 4/1979 | Iinuma | ................... G01K 7/245 324/707 |
| 4,816,748 | A | * | 3/1989 | Tazawa | ................... G01N 27/121 324/667 |
| 5,899,570 | A | * | 5/1999 | Darmawaskita | ....... G01K 7/203 374/170 |
| 7,459,983 | B2 | * | 12/2008 | Gyoten | .................... G01K 7/01 331/57 |
| 8,136,987 | B2 | * | 3/2012 | Luria | ....................... G01K 7/01 327/512 |
| 2007/0216376 | A1 | * | 9/2007 | Ogawa | ................... G01K 3/005 323/236 |
| 2013/0156069 | A1 | * | 6/2013 | Yun | .......................... G01K 7/32 374/170 |

FOREIGN PATENT DOCUMENTS

| | | |
|---|---|---|
| JP | 2003-28726 A | 1/2003 |
| JP | 2010-190767 A | 9/2010 |

* cited by examiner

*Primary Examiner* — Clayton E LaBalle
*Assistant Examiner* — Leon W Rhodes, Jr.
(74) *Attorney, Agent, or Firm* — Studebaker & Brackett PC

(57) ABSTRACT

The present invention provides a semiconductor device and a measurement method that enables high precision measurement of temperature or humidity or the like over a wide range. A semiconductor device of the present invention determines which is faster out of a reference oscillation and a thermistor oscillation, and using the faster oscillation as a reference, measures a count value based on the other oscillation. Moreover, the count based on the faster oscillation is employed as a reference value, and a count value based on the other oscillation when the reference value is taken as a measurement value. A frequency ratio is computed based on the reference value and the measurement value, and based on the computed frequency ratio, a table expressing correspondence relationships between frequency ratio and temperature is referred to and a temperature acquired.

14 Claims, 29 Drawing Sheets

RELATED ART

RELATED ART

RELATED ART

RELATED ART

SEMICONDUCTOR DEVICE AND MEASUREMENT METHOD

CROSS-REFERENCE TO RELATED APPLICATION

This application claims priority under 35 USC 119 from Japanese Patent Application No. 2013-062609, filed on Mar. 25, 2013, the disclosure of which is incorporated by reference herein.

BACKGROUND OF THE INVENTION

Field of the Invention

The present invention relates to a semiconductor device and measurement method.

Description of the Related Art

RC oscillator circuits (RC-ADCs) that generally employ a reference resistor, a resistance sensor including, for example, resistance that depends on temperature, and a capacitor element commonly employed for both the reference resistor and the resistive sensor, are known. Further, semiconductor devices that measure, for example, temperature or humidity using such an RC oscillator circuit, are known.

As semiconductor devices that are measurement devices using such RC oscillator circuit, for example, technologies described in Japanese Patent Application Laid-Open (JP-A) No. 2003-28726 and JP-A No. 2010-190767, are known.

However, in the technology described in JP-A No. 2003-28726, plural additional fuse circuits need to be provided, and high precision measurement cannot be performed since the influence from variation between the elements cannot be avoided.

Moreover, in the technology described in JP-A No. 2010-190767, although a counter that counts only a fraction of a sensor signal can prevent the counter from overflowing, high precision measurement cannot be performed due to smaller count values.

SUMMARY OF THE INVENTION

The present invention provides a semiconductor device and a measurement method that may measure temperature, humidity or the like, with high precision over a wide range.

A first aspect of the present invention is a semiconductor device including: a first counter that performs a count operation based on a signal of a first frequency; a second counter that performs a count operation based on a signal of a second frequency; and a control section that determines a higher frequency out of the first frequency or the second frequency based on a count value of the first counter and a count value of the second counter, measures the other frequency and computes a frequency ratio by using the higher frequency as a reference, and acquires a measurement value by referring to a specific table expressing correspondence relationships between the frequency ratio and the measurement values.

A second aspect of the present invention is a semiconductor device including: a first counter that performs a count operation based on a clock signal; a second counter that performs a count operation based on a signal of a first frequency and a signal of a second frequency; and a control section that determines a higher frequency out of the first frequency or the second frequency based on a count value of the first counter, a count value of the second counter that counts based on the signal of the first frequency, and a count value of the second counter that counts based on the signal of the second frequency, computes a frequency ratio by measuring the clock signal using the higher frequency as a reference, based on a measurement result of measuring the lower frequency using the clock signal as a reference, and acquires a measurement value by referring to a specific table expressing correspondence relationships between the frequency ratio and the measurement values.

A third aspect of the present invention is a measurement method performed by a semiconductor device that includes a first counter that performs a count operation based on a signal of a first frequency and a second counter that performs a count operation based on a signal of a second frequency, the measurement method including: determining a higher frequency out of the first frequency or the second frequency based on a count value of the first counter and a count value of the second counter, measuring the other frequency with the higher frequency as a reference, and computing a frequency ratio, and acquiring a measurement value by referring to a specific table expressing correspondence relationships between the frequency ratio and the measurement values.

A fourth aspect of the present invention is a measurement method performed by a semiconductor device that includes a first counter that performs a count operation based on a clock signal, a second counter that performs a count operation based on a signal of a first frequency and a signal of a second frequency, the measurement method including: determining a higher frequency out of the first frequency or the second frequency based on a count value of the first counter, a count value of the second counter counted based on the signal of the first frequency, and a count value of the second counter counted based on the signal of the second frequency, computing a frequency ratio by measuring the clock signal using the higher frequency as a reference, based on a measurement result of measuring the lower frequency using the clock signal as a reference, and acquiring a measurement value by referring to a specific table expressing correspondence relationships between the frequency ratio and the measurement values.

According to the above aspects, the present invention may enable high precision measurement of temperature, humidity or the like, to be performed over a wide range.

BRIEF DESCRIPTION OF THE DRAWINGS

Embodiments of the invention will be described in detail with reference to the following figures, wherein.

DETAILED DESCRIPTION OF THE INVENTION

Detailed explanation follows regarding the exemplary embodiments of the present invention, with reference to the drawings.

[First Exemplary Embodiment]

Figure 1:
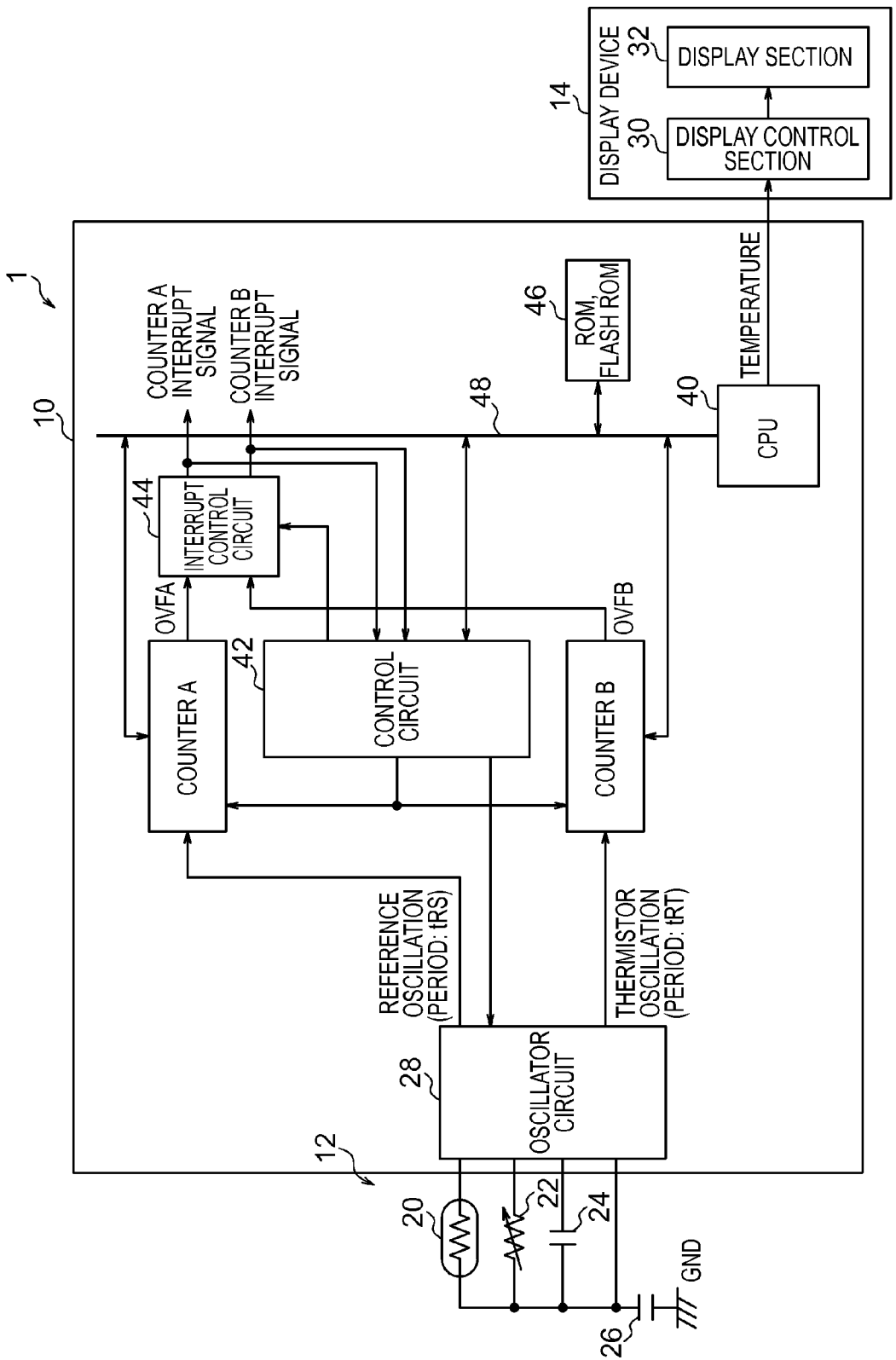
FIG. 1 is a schematic configuration diagram of an electronic device including a semiconductor device that is a measurement device employing an RC oscillator circuit of a first exemplary embodiment.

Explanation first follows regarding a configuration of an electronic device of the present exemplary embodiment including a semiconductor device which is a measurement device employing an RC oscillator circuit. FIG. 1 illustrates a schematic configuration diagram of an electronic device including the semiconductor device, the measurement device employing an RC oscillator circuit of the present exemplary embodiment.

An electronic device 1 illustrated in FIG. 1 is, as a specific example, a thermometer. The electronic device 1 of the present exemplary embodiment includes a semiconductor device 10, a RC oscillator circuit 12 and a display device 14. The electronic device 1 indicates, on the display device 14, a temperature of the semiconductor device 10, detected based on a frequency ratio between a reference oscillation output from the RC oscillator circuit 12 and a thermistor oscillation.

The display device 14 is equipped with a display control section 30 and a display section 32, and is for example a Liquid Crystal Display (LCD). The semiconductor device 10 has a function to indicate the temperature (measurement value) input from a CPU 40 of the semiconductor device 10 with the display section 32 (liquid crystal display) by control of the display control section 30. Note that, there are no particular limitations to the configuration of the display control section 30. There are also no particular limitations to the method of indication by the display device 14, and indication may be performed by visual display, or by audio indication.

The RC oscillator circuit 12 is an RC oscillator circuit in which the current through a capacitor 26 and either a thermistor 20 or a reference resistor 22 oscillates. The RC oscillator circuit 12 of the present exemplary embodiment is equipped with the thermistor 20, the reference resistor 22, a capacitor 24, the capacitor 26, and an oscillator circuit 28. In the present exemplary embodiment, the thermistor 20, the reference resistor 22, the capacitor 24 and the capacitor 26 are provided externally to the semiconductor device 10. The oscillator circuit 28 is, however, internally provided to the semiconductor device 10. The oscillator circuit 28 includes plural inverter circuits.

The RC oscillator circuit 12 outputs, to the semiconductor device 10, a reference oscillation signal from RC oscillation, through the reference resistor 22, and the capacitor 24 and the capacitor 26. The RC oscillator circuit 12 also outputs, to the semiconductor device 10, a thermistor oscillation signal from RC oscillation, through the thermistor 20, and the capacitor 24 and the capacitor 26. Each of the oscillation frequencies are determined by time-constants thereof.

The thermistor oscillation frequency becomes higher when the temperature rises. On the other hand, the frequency of the reference oscillation signal does not change. Accordingly, a change in the frequency ratio between the reference oscillation signal frequency and the thermistor oscillation signal frequency occurs when the temperature changes.

The semiconductor device 10 determines the temperature by employing a table expressing correspondence relationships between the frequency ratio of the reference oscillation frequency (cycle) and the thermistor oscillation frequency (cycle) to temperature, and outputs the determined temperature to the display device 14. Note that, by employing the frequency ratio as in the present exemplary embodiment, variation in the capacity of the RC oscillator circuit 12 (of the capacitor 24 and the capacitor 26) may be cancelled, and therefore, may enable higher precision measurement.

The semiconductor device 10 of the present exemplary embodiment includes the CPU 40, a control circuit 42, an interrupt control circuit 44, ROM 46, a counter A and a counter B. The counter A, the counter B, the CPU 40, the control circuit 42 and the ROM 46 are connected together through a data bus 48 that enables signals to be sent and received between each other.

The semiconductor device 10 of the present exemplary embodiment is also equipped with the oscillator circuit 28 as described above. The signal (referred to below as reference oscillation, for simplicity) of the reference oscillation output from the oscillator circuit 28 (cycle: tRS, frequency: 1/tRS) is input to the counter A. The counter A is a counter circuit that counts the reference oscillation. In the present exemplary embodiment, as a specific example, a 16 bit counter circuit is employed, with a maximum count value of the hexadecimal number "FFFFH". However, the signal (referred to below as thermistor oscillation, for simplicity) of the thermistor oscillation output from the oscillator circuit 28 (cycle: tRT, frequency: 1/tRT) is input to the counter B. The counter B is a counter circuit that counts the thermistor oscillation. In the present exemplary embodiment, as a specific example, the counter circuit of the counter B employs a similar to the counter A.

When the count overflows, a signal OVFA is output from the counter A to the interrupt control circuit 44 to indicate that overflow has occurred. Similarly, when count overflows, a signal OVFB is output from the counter B to the interrupt control circuit 44 to indicate overflow has occurred.

The interrupt control circuit 44 outputs a counter A interrupt signal to the control circuit 42 when the counter A has overflowed. The interrupt control circuit 44 outputs a counter B interrupt signal to the control circuit 42 when the counter B has overflowed.

The control circuit 42 controls operation of the counter A and the counter B, according to the counter A interrupt signal and the counter B interrupt signal input from the interrupt control circuit 44. The control circuit 42 has a register, and, under control from the CPU 40, selects one out of reference oscillation or thermistor oscillation, starts the oscillation, or stops the oscillation. The control circuit 42 also determines a faster oscillation out of the reference oscillation or the thermistor oscillation. Note that, in the present exemplary embodiment "faster oscillation" means that the cycle of oscillation is shorter and the oscillation frequency is higher.

The CPU 40 computes the frequency ratio between the reference oscillation and the thermistor oscillation. Further, the CPU 40 refers to the table, expressing correspondence relationships between frequency ratio and temperature, that have been pre-stored in the ROM 46, and outputs the temperature to the display device 14. Note that, in the present exemplary embodiment, a flash ROM is employed as an example for the ROM 46. However, there is no particular limitation thereto. Any non-volatile storage section may be employed for the ROM 46. Further, the CPU 40 may determine the faster oscillation out of the reference oscillation or the thermistor oscillation.

Explanation next follows regarding temperature detection operation by the semiconductor device 10 of the present exemplary embodiment, employing the RC oscillator circuit 12.

Figure 2:
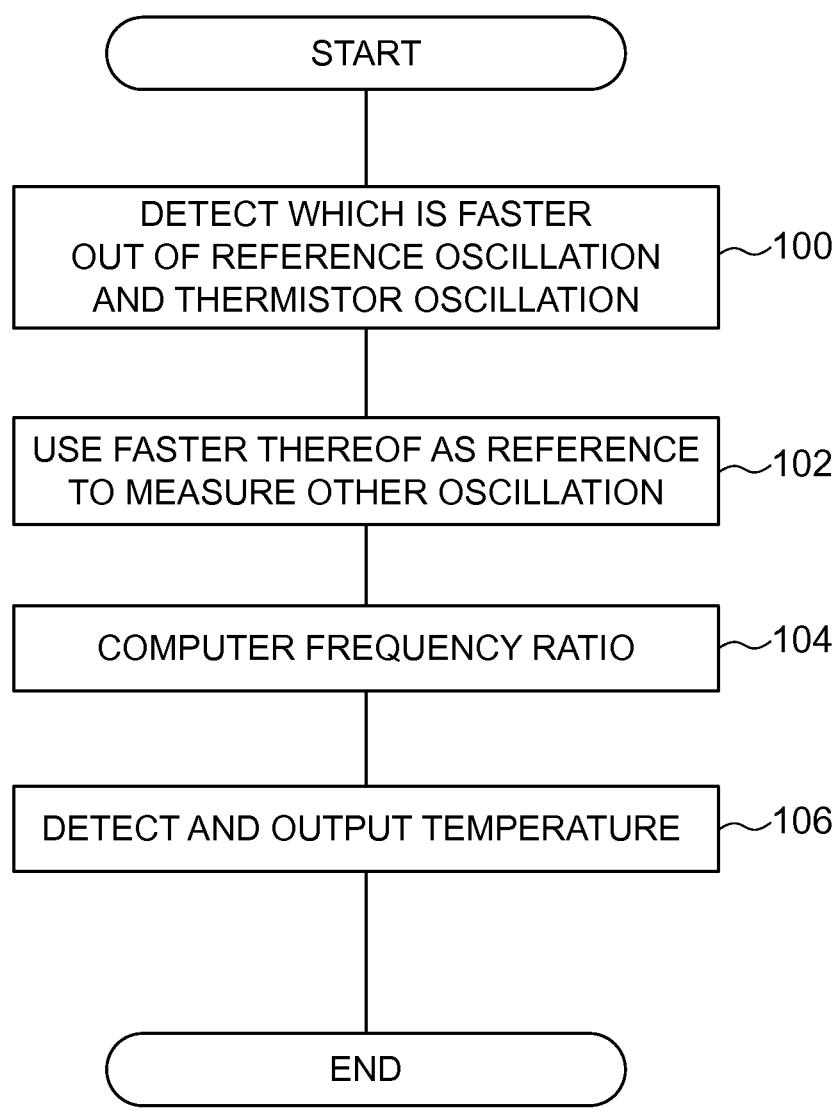
FIG. 2 is a flow chart illustrating a flow of temperature detection operation by a semiconductor device of the first exemplary embodiment.

FIG. 2 is a flow chart illustrating an example of flow in temperature detection operation by the semiconductor device 10 of the present exemplary embodiment. Explanation first follows regarding an outline of the overall flow in temperature detection operation, with reference to FIG. 2.

In the temperature detection operation of the present exemplary embodiment, first detection is made as to detect the faster oscillation out of the reference oscillation or the thermistor oscillation (step 100). Then, the count value based on the other oscillation is measured (counted by the counter), using the faster oscillation of the reference oscillation or the thermistor oscillation as a reference (step 102). The count based on the faster oscillation is employed as the reference value, and the count value based on the other oscillation at the point when the reference value has been counted, is taken as the measurement value.

Then, the frequency ratio based on the reference value and the measurement value is computed (step 104). Next, based on the computed frequency ratio, the table expressing correspondence relationships between the frequency ratio and temperature is referred to, and the acquired corresponding temperature are output to the display device 14 (step 106).

Explanation follows regarding further details of each of the operations, with reference to FIG. 3 to FIG. 7. In the schematic diagrams of FIG. 3 to FIG. 7, the CPU 40, the control circuit 42 and the interrupt control circuit 44 are illustrated as a logical multiplication/division circuit 50.

Figure 3:
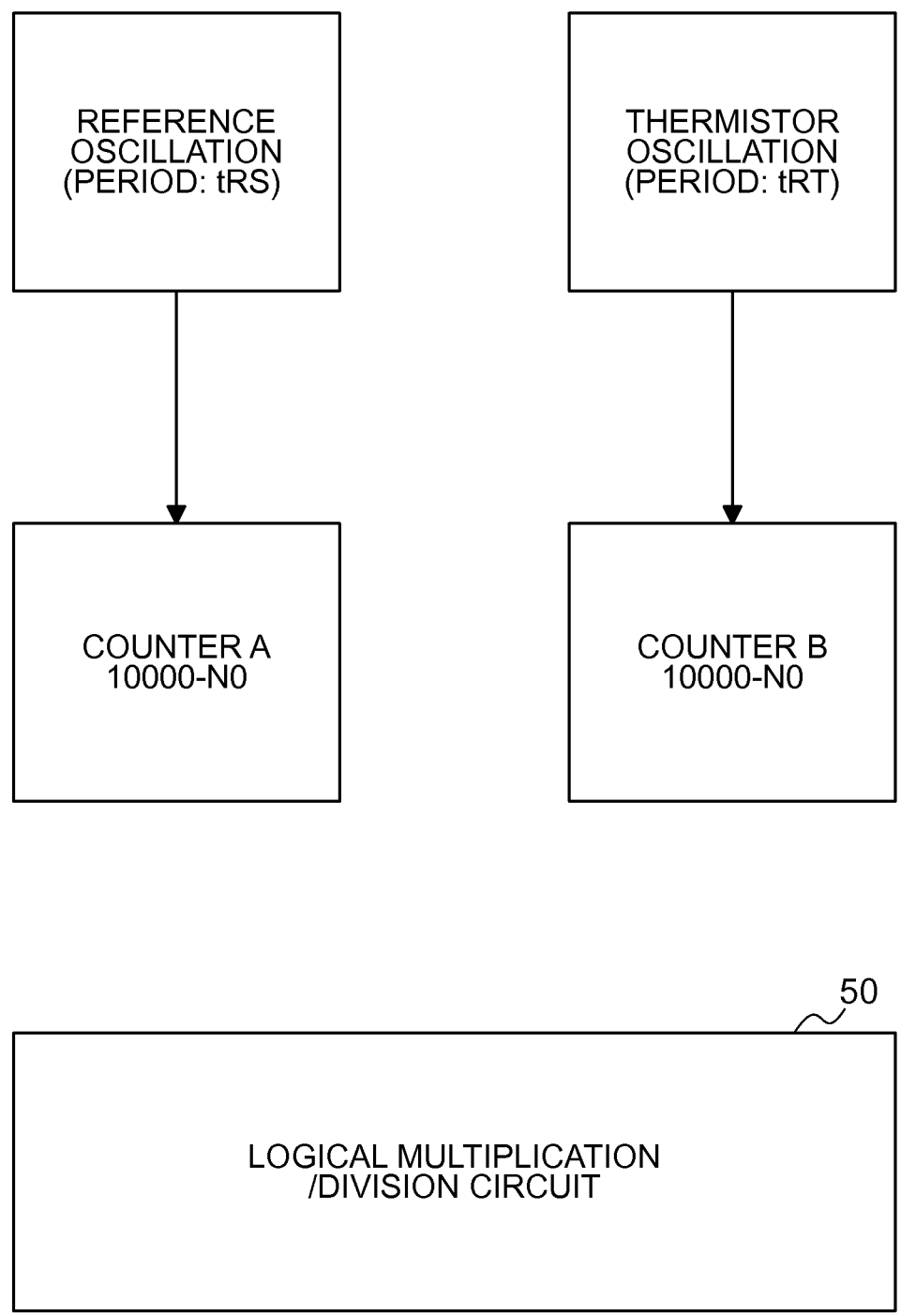
FIG. 3 is a schematic diagram of a temperature detection operation by a semiconductor device of the first exemplary embodiment.

First explanation follows with reference to FIG. 3. The counter A that counts the reference oscillation is preset with a value in which "FFFFH (i.e., maximum value)"+"1H" (="10000H")–N0 (i.e., a specific value). Similarly, the counter B that counts the thermistor oscillation is preset with "10000H"–N0. Specific value N0 here is an arbitrary value. There are no particular limitations to N0, and any value may be used based on the speed of the reference oscillation and the thermistor oscillation, and the counter A and the counter B.

The counter A and the counter B start counting the reference oscillation and the thermistor oscillation at the same time.

Figure 4:
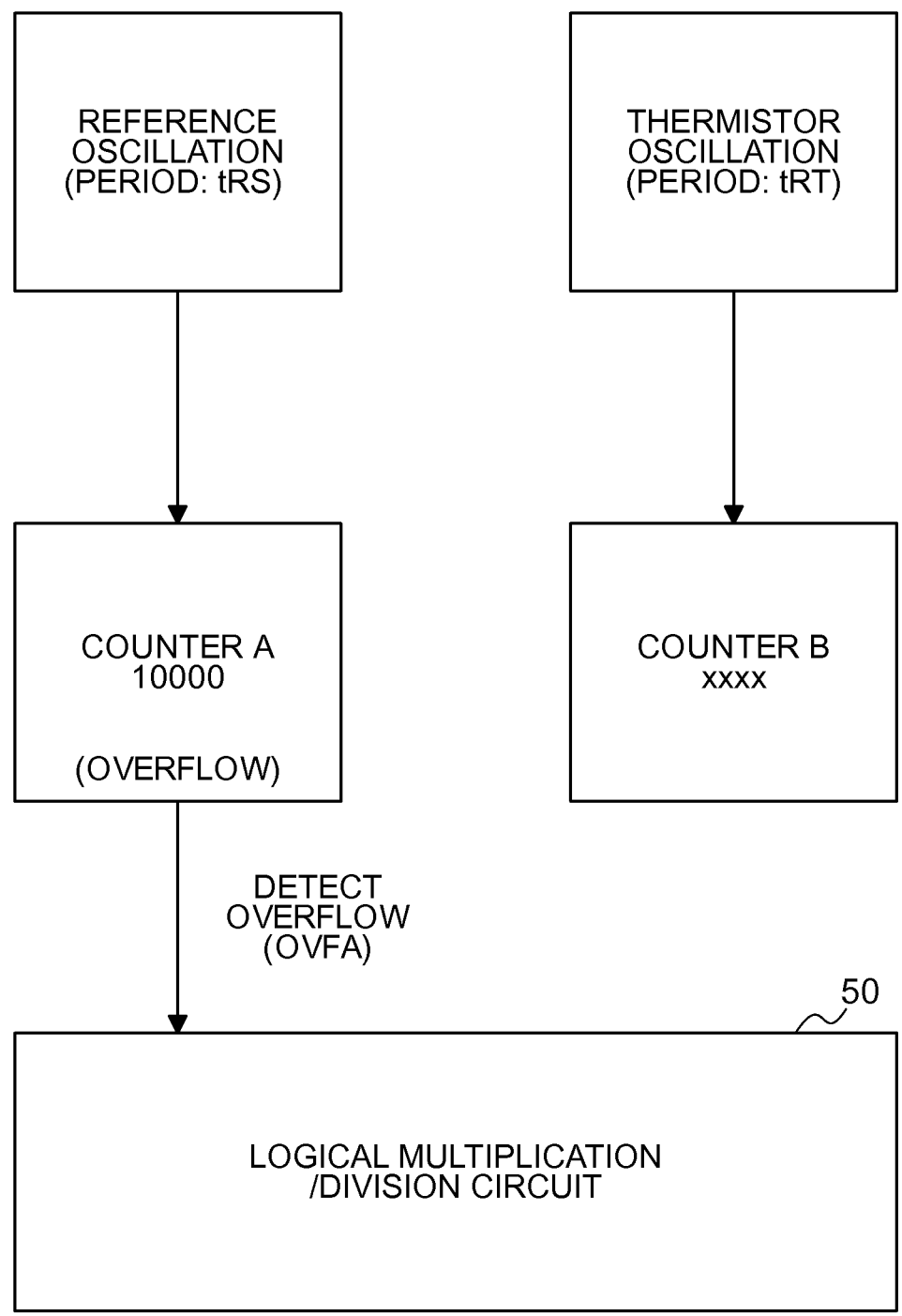
FIG. 4 is a schematic diagram of a temperature detection operation by a semiconductor device of the first exemplary embodiment.

Explanation of the next operation follows, with reference to the schematic diagram of FIG. 4.

As counting progresses, one of the counter A or the counter B reaches the maximum value first, then, the counter overflows. The signal indicating overflow from the overflowed counter (OVFA or OVFB) is output to the logical multiplication/division circuit 50. FIG. 4 illustrates, as an example, a case in which the counter A has overflowed, and the OVFA signal from the counter A has been output to the logical multiplication/division circuit 50.

In the present exemplary embodiment, when the counter A has overflowed first, the logical multiplication/division circuit 50 outputs the counter A interrupt signal, and counting of the counter B that counts the thermistor oscillation is stopped in response to the counter A interrupt signal. Accordingly, the logical multiplication/division circuit 50 does not detect overflow of the counter B.

Note that, in a reversed case to that illustrated in FIG. 4, namely, when the counter B overflows first, the logical multiplication/division circuit 50 outputs the counter B interrupt signal, and counting of the counter A is stopped in response to the counter B interrupt signal, and overflow of the counter A is not detected.

Moreover, when overflows of the counter A and the counter B is detected at the same time (for example, a case in which reference oscillation cycle tRS=thermistor oscillation cycle tRT), the overflow of one of counter A or the counter B is detected. For example, configuration may be made such that overflow of a pre-determined counter out of the counter A and the counter B is detected, may be employed.

Through the above operation, the logical multiplication/division circuit 50 determines whether the reference oscillation or the thermistor oscillation is faster. When the counter A overflows first (i.e., when the counting of the counter A is faster than the counting of the counter B), this indicates that the reference oscillation is faster than the thermistor oscillation. Similarly, when the counter B overflows first (i.e., when the count of the counter B is faster than the counting of the counter A), this indicates that the thermistor oscillation is faster than the reference oscillation.

Figure 5:
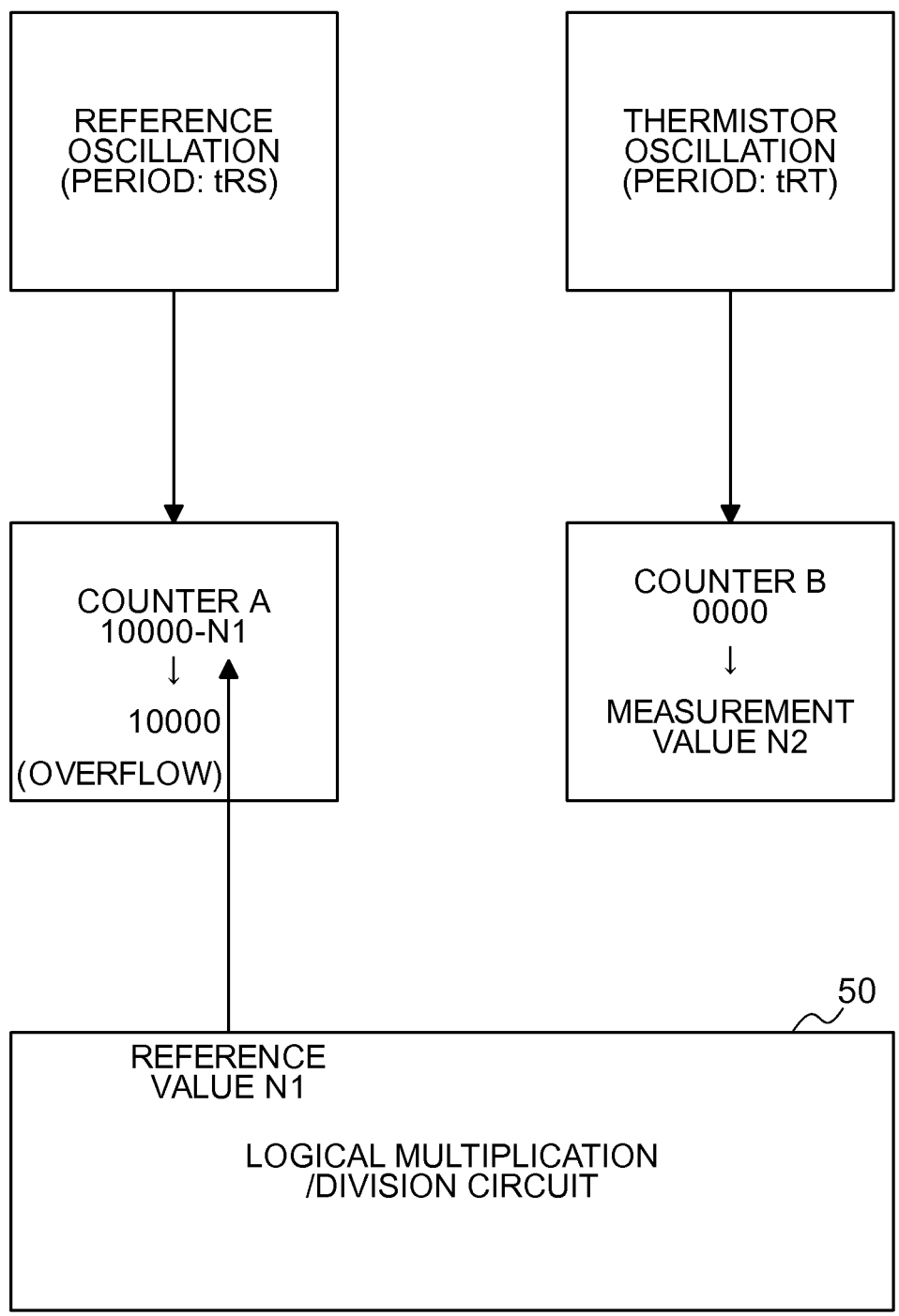
FIG. 5 is a schematic diagram of temperature detection operation by a semiconductor device of the first exemplary embodiment, following on from the operation illustrated in FIG. 4.

Explanation of the next operation follows, with reference to the schematic diagram of FIG. 5. FIG. 5 illustrates a case in which the counter A has overflowed first, namely a case in which the reference oscillation is faster than the thermistor oscillation.

The counter A is preset to "10000H"—reference value N1, and the counter B is preset to initial value "0000H". The reference value N1 here is, similarly to the N0, an arbitrary value. Note that N1 may be set equal to N0.

The logical multiplication/division circuit 50 starts counting both the counter A and the counter B at the same time. The logical multiplication/division circuit 50 detects that that the counter A has overflowed from the OVFA signal, and stops the counting in the counter B. When this occurs, the due to the reference oscillation being the faster oscillation, an overflow occurs in the counter A before occurring in the counter B.

Figure 6:
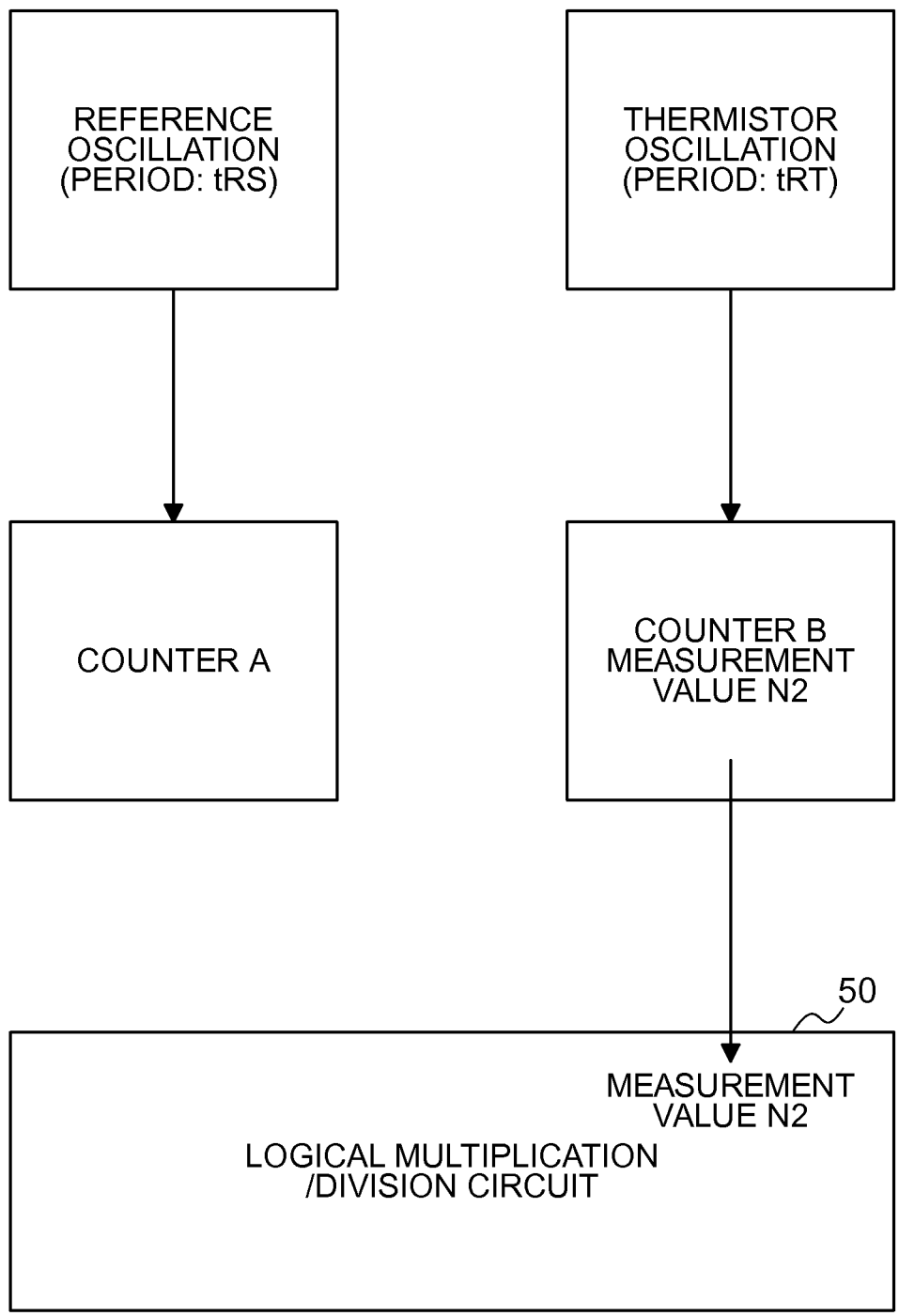
FIG. 6 is a schematic diagram of temperature detection operation by a semiconductor device of the first exemplary embodiment, following on from the operation illustrated in FIG. 5.

Explanation of the next operation follows, with reference to the schematic diagram of FIG. 6.

The counter A stores, in the logical multiplication/division circuit 50, a count value N2 of the counter B at the point of time when the counter A has overflowed. Note that, the count value N2 is a measurement value of the counter B with respect to the reference value N1, and so is called "measurement value N2".

The measurement value N2 at this point of time can be expressed by following Formula (1). Note that, frequency ratio: tRS/tRT represents a ratio of the thermistor oscillation frequency (1/tRT) with respect to the reference oscillation frequency (1/tRS).

$$N2 = N1 \times (tRS/tRT) \quad \text{Formula (1)}$$

Figure 7:
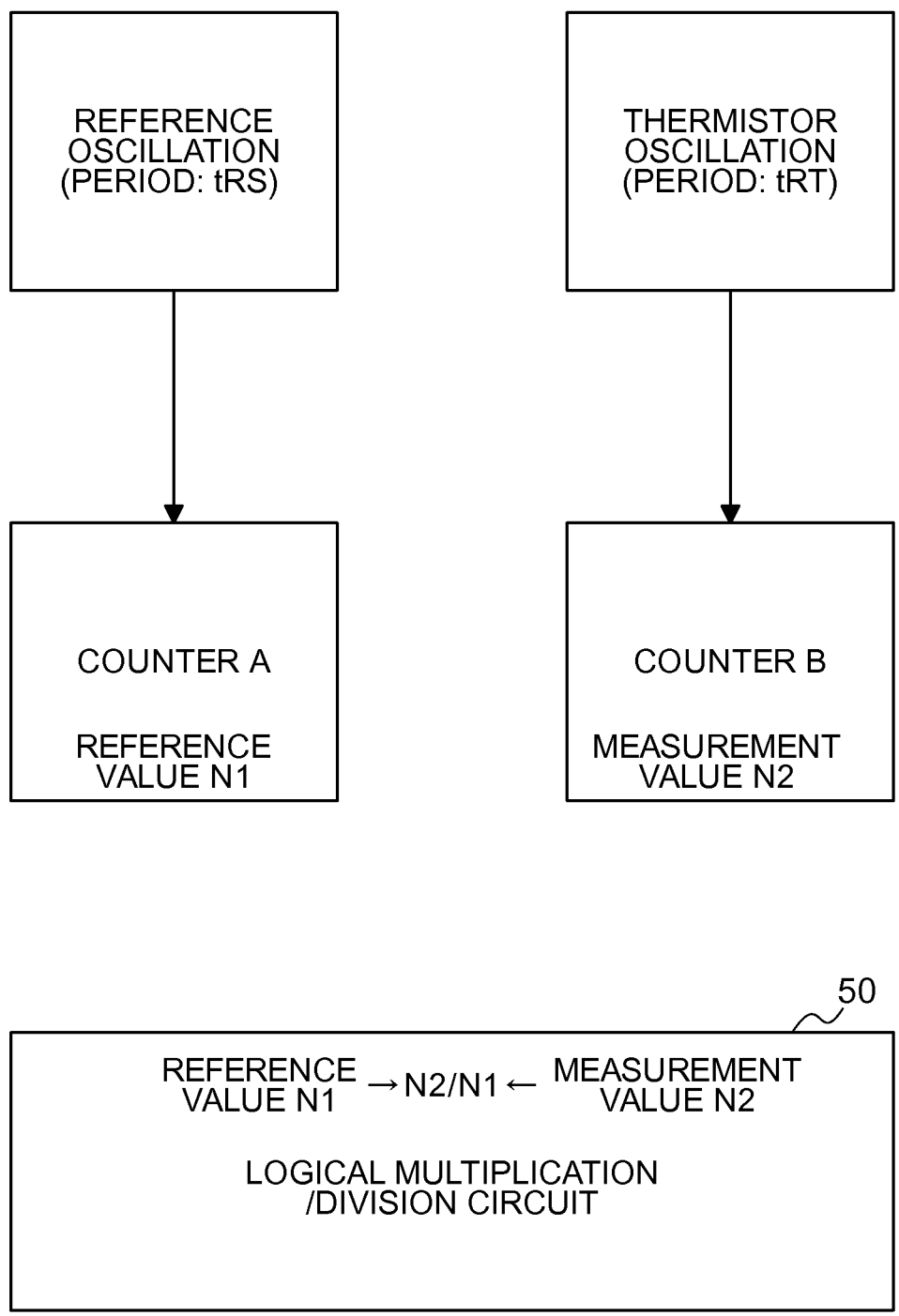
FIG. 7 is a schematic diagram of temperature detection operation by a semiconductor device of the first exemplary embodiment, following on from the operation illustrated in FIG. 6.

Explanation of the next operation follows, with reference to the schematic diagram of FIG. 7.

In the logical multiplication/division circuit 50, the measurement value N2/reference value N1 is calculated by a multiplication/division circuit. Namely, following Formula (2) is calculated.

$$N2/N1 = tRS/tRT \quad \text{Formula (2)}$$

The logical multiplication/division circuit 50 refers to the table stored in the ROM 46 expressing correspondence relationships between the tRS/tRT (frequency ratio) and temperature, acquires the corresponding temperature, and outputs the acquired temperature to the display device 14.

Thus, in the present exemplary embodiment, the temperature is detected by the semiconductor device 10 using the RC oscillator circuit 12.

Note that, a similar operation may also be performed in cases in which the thermistor oscillation is faster than the reference oscillation, namely, when counting is faster and overflow occurs earlier in the counter B.

Namely, the counter B is preset with "10000H"–N1', and the counter A is preset to initial value "0000H". Note that N1' is a reference value, and the reference value N1' is, similarly to the N0, an arbitrary value and may be set equal to N0. Further, N1 may also be set equal to N1'.

The logical multiplication/division circuit 50 starts counting both the counter A and the counter B at the same time, and stops the counting of the counter A when overflow in the counter B is detected due to the OVFB signal. The logical multiplication/division circuit 50 stores in the logical multiplication/division circuit 50 a count value (measurement value) N2' of the counter A when the counter B has overflowed. The measurement value N2' at this point may be expressed by following Formula (3).

$$N2' = N1' \times (tRS/tRT) \quad \text{Formula (3)}$$

The measurement value N2'/reference value N1' is also calculated by a multiplication/division circuit in the logical multiplication/division circuit 50. Namely, following Formula (4) is calculated.

$$N1'/N2' = tRS/tRT \quad \text{Formula (4)}$$

The logical multiplication/division circuit 50 then refers to the table stored in the ROM 46 expressing correspondence relationships between tRS/tRT (frequency ratio) and temperature, acquires the corresponding temperature, and outputs the acquired temperature to the display device 14.

Note that, in such cases, the present exemplary embodiment is no limited to calculating reference value N1'/measurement value N2', and may instead calculate measurement value N2'/reference value N1'. In such cases, tRT/tRS is calculated in the multiplication/division circuit. A table is accordingly pre-stored in the ROM 46 with frequency ratio: tRS/tRT and frequency ratio: tRT/tRS, with a boundary present at the center therebetween. Such table uses the boundary (turning point) where tRS=tRT to discriminate between a region of frequency ratio: tRS/tRT (a region referred to when the reference oscillation cycle tRS is greater than the thermistor oscillation cycle tRT), and a region of frequency ratio: tRT/tRS (a region referred to when the thermistor oscillation cycle tRT is greater than the reference oscillation cycle tRS). Note that, in the present exemplary embodiment, the two regions of the table are including tRT=tRS as the boundary therebetween, however there is no limitation thereto, and portions of the two regions may overlap with each other. Namely, a table may include a region of the frequency ratio: tRS/tRT, where the thermistor oscillation cycle tRT is smaller than the reference oscillation cycle tRS, plus a permissible value, and a region of the frequency ratio: tRT/tRS, where the thermistor oscillation cycle tRT is greater than the reference oscillation cycle tRS, minus a permissible value. Moreover, the above determination result may be employed to determine the faster oscillation out of the reference oscillation or the thermistor oscillation, with the region of the frequency ratio: tRS/tRT being referred to when the reference value is faster, and the region of the frequency ratio: tRT/tRS being referred to when the thermistor oscillation is faster. The logical multiplication/division circuit 50 may refer to the table in this manner and output the acquired corresponding temperature to the display device 14.

In the semiconductor device 10 of the present exemplary embodiment, first, determines the faster oscillation out of the reference oscillation or the thermistor oscillation, and, by using the faster (or same speed) oscillation out of the reference oscillation or the thermistor oscillation for reference, measures a count value based on the other oscillation. Moreover, a count based on the faster oscillation is used as the reference value, and the count value based on the other oscillation is taken as the measurement value when the reference value is counted. The frequency ratio is computed based on the reference value and the measurement value, and, based on the computed frequency ratio, the corresponding temperature is acquired by referring to the table expressing correspondence relationships between frequency ratio and temperature.

In the present exemplary embodiment, by setting the faster oscillation as the reference (by counting the reference value N1 or N1' based on the faster oscillation), counter that counts the measurement values N2, N2' does not overflow. Moreover, since the reference values N1, N1' may be set right up to the count length (the maximum value of the counter), the reference values N1, N1' may be determined with ease when designing. Moreover, since volume of data increases when the reference values N1, N1' becomes larger, the measurement precision also improves when the reference values N1, N1' are larger. Moreover, when the reference values N1, N1' are made smaller, measurements may be performed quicker, since the count time for counting becomes shorter. Thus, since larger or smaller of the reference values N1, N1' has a simple trade-off relationship, the semiconductor device 10 of the present exemplary embodiment may be utilized in various specifications.

Moreover, by performing measurement by using the semiconductor device 10 of the present exemplary embodiment, the present invention may overcome an issue, that occurred in conventional devices, such as overflow occurs in measurement value due to the reference value being too large, or precise measurement cannot be performed due to not achieving a sufficiently high count number (not being a desired value) for the measurement value when the reference value is too small (for details see the comparative example described later).

Namely, the semiconductor device 10 of the present exemplary embodiment may suppress occasions of cases in which no measurement can be performed, and may enable high precision measurement when long time for measurement is secured. Accordingly, the semiconductor device 10 of the present exemplary embodiment may perform high precision measurement over a wide range.

Note that, in the present exemplary embodiment, a case in which the counter A is a counter for counting the reference oscillation and the counter B is a counter for counting the thermistor oscillation, has been described. However, there is no limitation thereto. For example, the counter that overflows first may be made the counter A, and the latter may be made the counter B.

[Second Exemplary Embodiment]

Explanation follows regarding a second exemplary embodiment. Note that, detailed explanation of configurations and operations that are similar to that of the first exemplary embodiment will be omitted.

Figure 8:
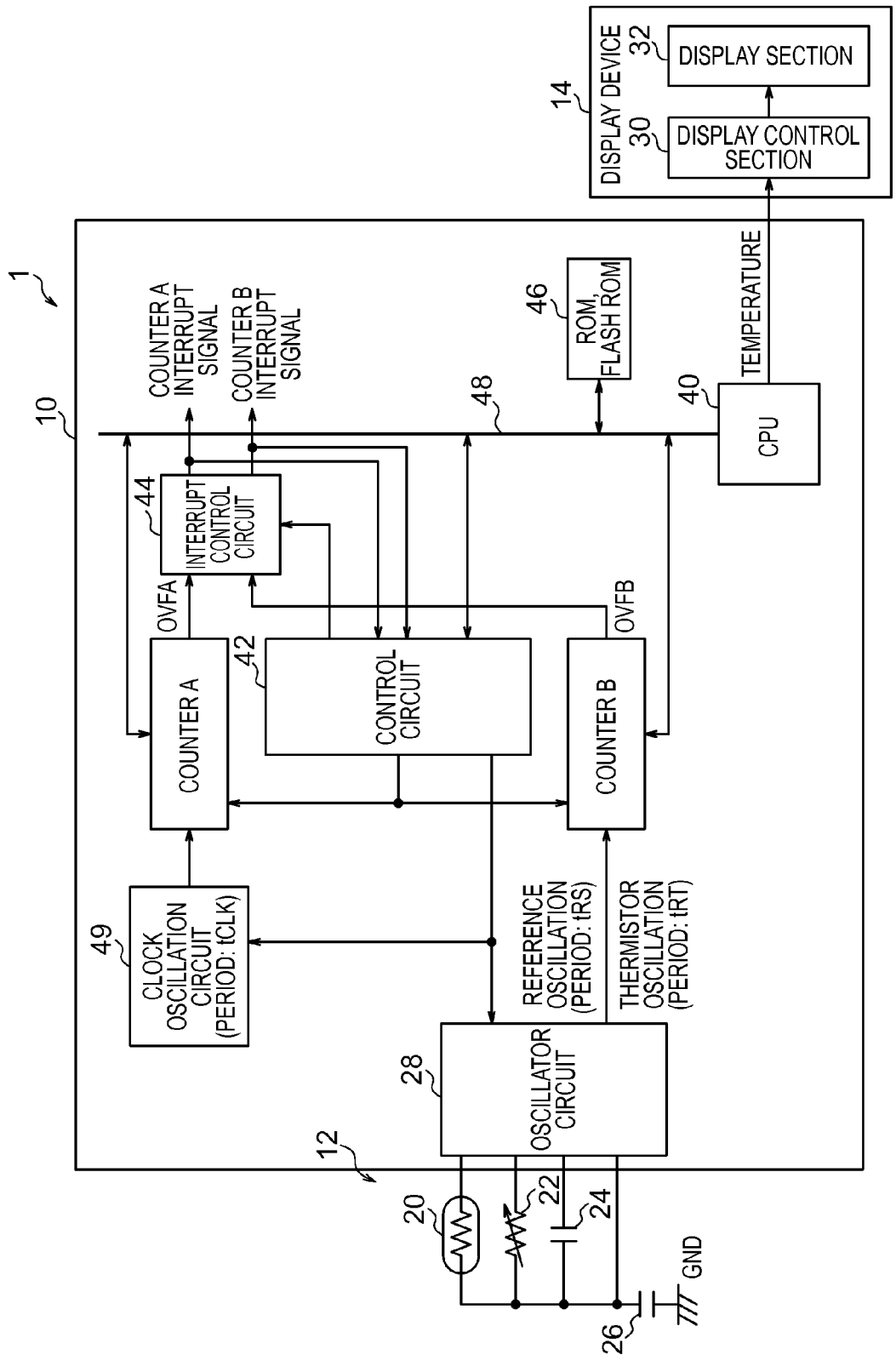
FIG. 8 is a schematic configuration diagram of an electronic device including a semiconductor device that is a measurement device employing an RC oscillator circuit of a second exemplary embodiment.

FIG. 8 illustrates a schematic configuration diagram of an electronic device of the present exemplary embodiment including a semiconductor device that is a measurement device employing an RC oscillation circuit. As illustrated in FIG. 8, a semiconductor device 10 of the present exemplary embodiment differs from the semiconductor device 10 of the first exemplary embodiment, in that a clock oscillation circuit 49 is provided.

The clock oscillation circuit 49 outputs a clock signal of cycle: tCLK (referred to below for simplicity as a clock oscillation) to a counter A.

Moreover, as illustrated in FIG. 8, the semiconductor device 10 of the present exemplary embodiment also differs from the semiconductor device 10 of the first exemplary embodiment in that both the reference oscillation and the thermistor oscillation output from the oscillator circuit 28 are input to the counter B.

Figure 9:
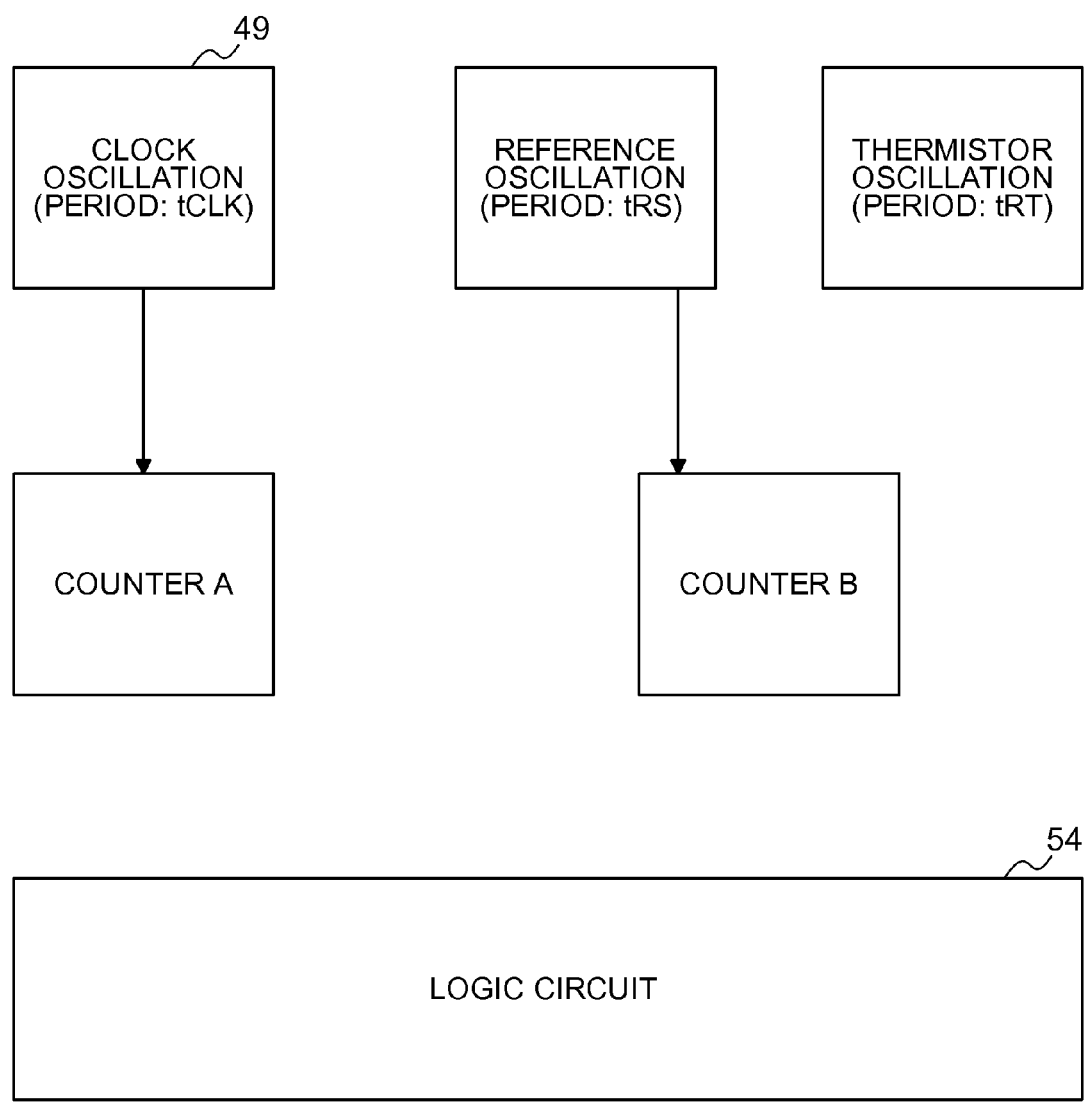
FIG. 9 is a schematic diagram by a semiconductor device of the second exemplary embodiment.

Moreover, FIG. 9 illustrates a schematic diagram schematically illustrating the semiconductor device 10 of the present exemplary embodiment illustrated in FIG. 8. As illustrated in FIG. 9, the semiconductor device 10 of the present exemplary embodiment differs in that a logic circuit 54 is not including a multiplication/division circuit, in contrast to the logical multiplication/division circuit 50 of the first exemplary embodiment.

Explanation follows regarding temperature detection operation with semiconductor device 10 of the present exemplary embodiment using a RC oscillator circuit 12.

Figure 10:
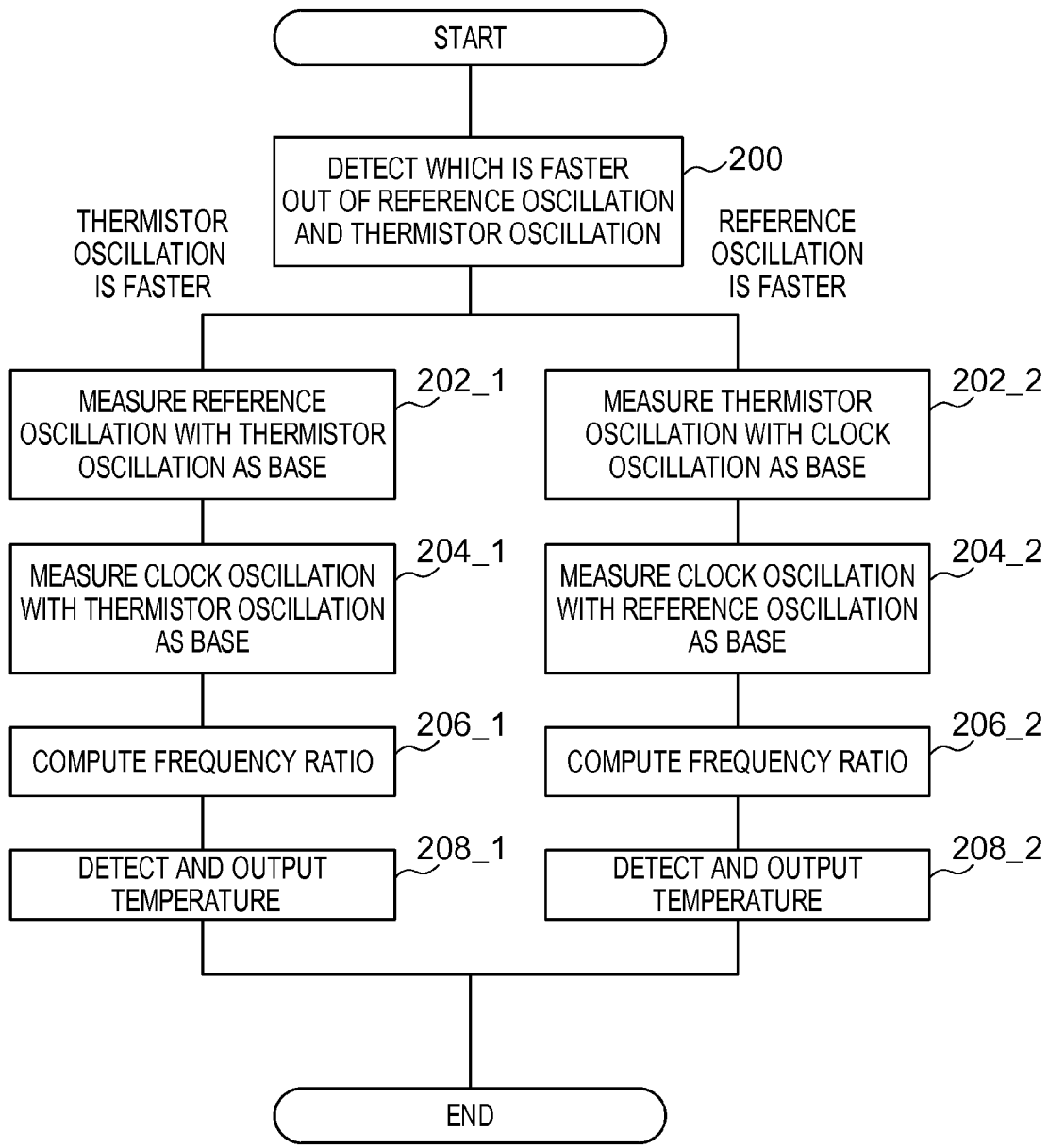
FIG. 10 is a flow chart illustrating a flow of temperature detection operation by a semiconductor device of the second exemplary embodiment.

FIG. 10 is a flow chart illustrating a flow of temperature detection operation by the semiconductor device 10 of the present exemplary embodiment. Explanation first follows regarding an outline of the overall flow in temperature detection operation, with reference to FIG. 10.

In the temperature detection operation of the present exemplary embodiment, first, the faster oscillation out of the reference oscillation or the thermistor oscillation (step 200) is detected. Then, the slower oscillation out of the reference oscillation or the thermistor oscillation is measured using the clock oscillation as a base. When the thermistor oscillation is the faster, the reference oscillation is measured with the clock oscillation as the base (step 202_1). On the other hand, when the reference oscillation is the faster, the thermistor oscillation is measured with the clock oscillation as the base (step 202_2).

Next, the clock oscillation is measured with the faster oscillation out of the reference oscillation or the thermistor oscillation as a base. When the thermistor oscillation is the faster, the clock oscillation is measured with the thermistor oscillation as the base (step 204_1). On the other hand, when the reference oscillation is the faster, the clock oscillation is measured with the reference oscillation as the base (step 204_2).

In the semiconductor device 10 of the present exemplary embodiment, counter overflow can be prevented by performing measurement (operation) in such a sequence.

Next, both when the thermistor oscillation is the faster and when the reference oscillation is the faster, the respective frequency ratio is computed (step 206_1, step 206_2). Further, based on the computed frequency ratio, a table expressing correspondence relationships between frequency ratio and temperature is referred to, and the acquired corresponding temperature is output to the display device 14 (step 208_1, 208_2).

Detailed explanation follows regarding each operation, with reference to FIG. 11 to FIG. 14.

First, explanation follows regarding the detection (determination) operation at step 200, that detects the faster oscillation out of the reference oscillation or the thermistor oscillation, with reference to the schematic diagrams of FIG. 11 to 14.

Figure 11:
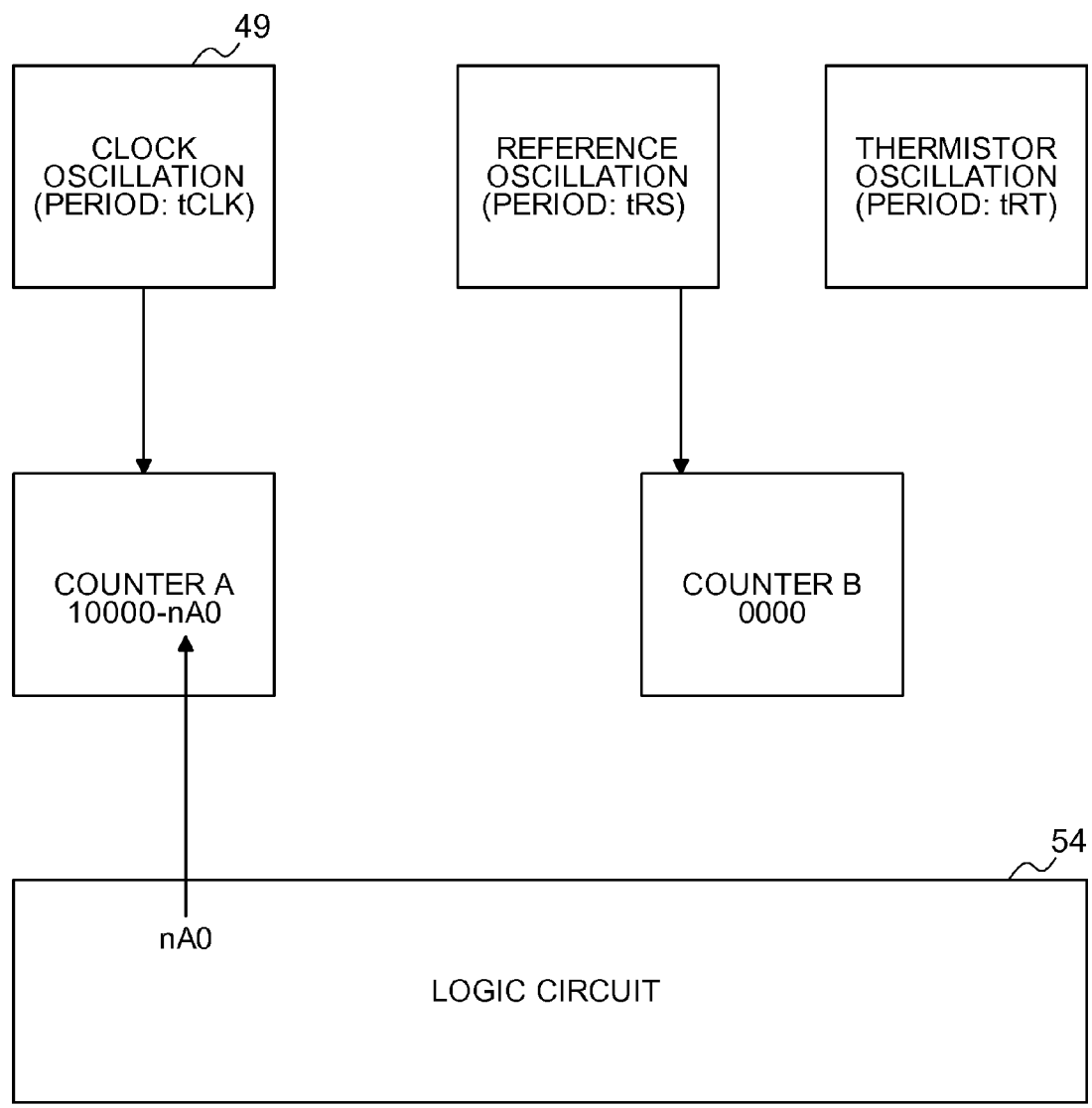
FIG. 11 is a schematic diagram of a temperature detection operation by a semiconductor device of the second exemplary embodiment.

First, a reference oscillation is measured with the clock oscillation as the base. Accordingly, each counter is set, as illustrated in FIG. 11. The counter A that measures the clock oscillation is preset with a value "FFFFH (i.e., the maximum value)"+"1H" (="10000H")−nA0 (i.e., a specific value). Accordingly, in the counter A, overflow occurs when nA0 cycle counts have been performed, and an OVFA signal indicating that overflow has occurred is output from the counter A. Note that, the specific value nA0 is an arbitrary value, similarly to N0 of the first exemplary embodiment.

Further, the counter B that measures the reference oscillation is preset with an initial value "0000H".

Figure 12:
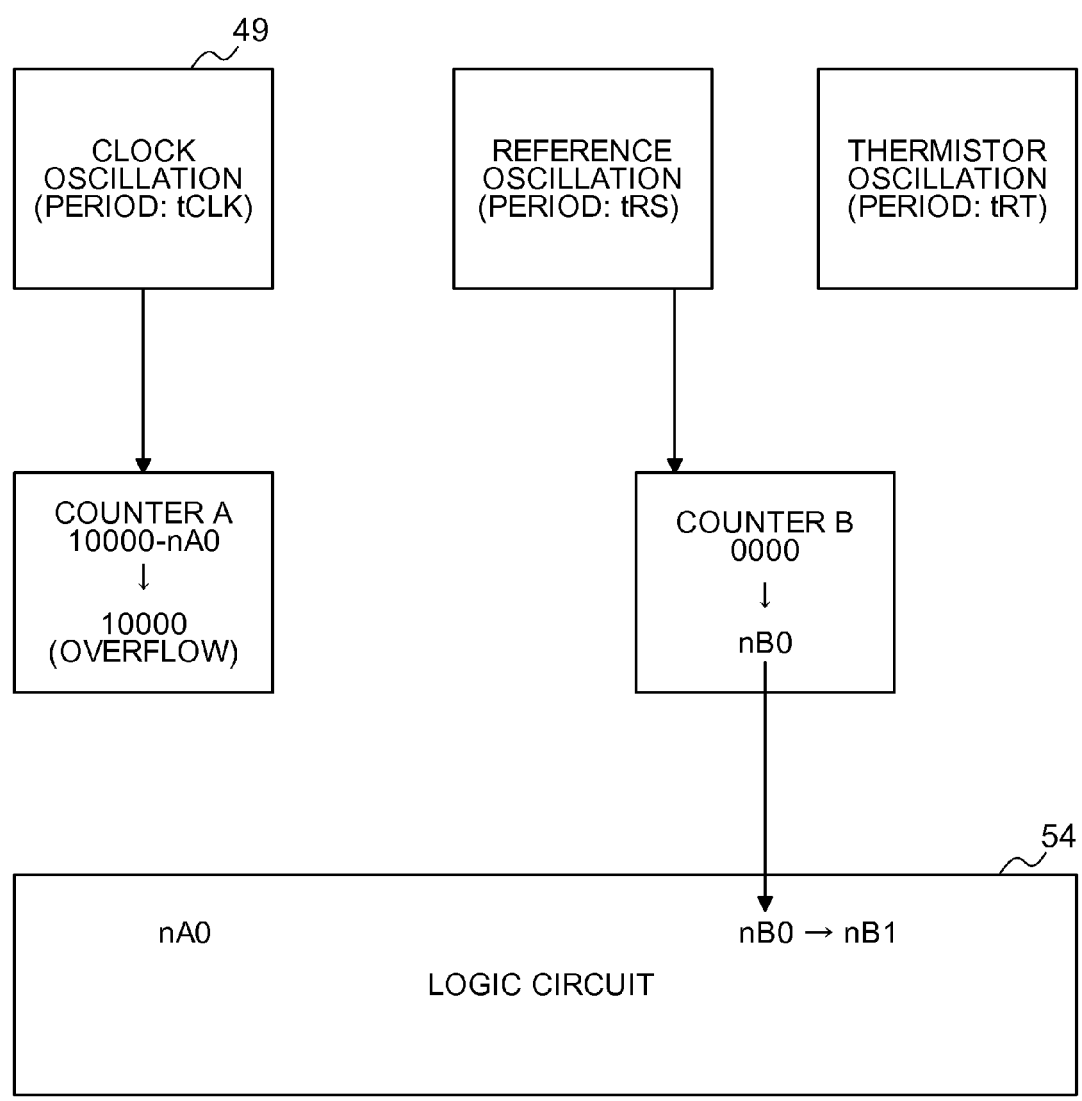
FIG. 12 is a schematic diagram of temperature detection operation by a semiconductor device of the second exemplary embodiment, following on from the operation illustrated in FIG. 11.

Explanation follows regarding the next operation, with reference to the schematic diagram of FIG. 12. Note that FIG. 12 illustrates a state after the reference oscillation has been measured with the clock oscillation as the base.

The logic circuit 54 respectively counts the clock oscillation in the counter A, and the reference oscillation in the counter B. The counter A reaches "10000H" after counting nA0 cycle counts, overflow occurs, and the OVFA signal is output. In the logic circuit 54, counting of the counter B is stopped based on a counter A interrupt signal output in response to the OVFA signal. The count value of the counter B is set as nB0 at this point.

This nB0 is stored in memory in the logic circuit 54. The nB0 stored in the memory is set as nB1. Namely, becomes nB0=nB1.

Note that, when the value of nA0 is too large and the reference oscillation is too fast, the counter B may overflow before the counter A. This may be suppressed by making the reference oscillation frequency and the clock oscillation about the same speed to each other, and accordingly, a simplification in design may be achieved. Accordingly, the clock oscillation may be used in place of the reference oscillation.

In such cases, the following Formula (5) and Formula (6) is satisfied.

$$nA0 \times tCLK = nB1 \times tRS \qquad \text{Formula (5)}$$

$$nB0 = nA0 \times (tCLK/tRS) \qquad \text{Formula (6)}$$

Figure 13:
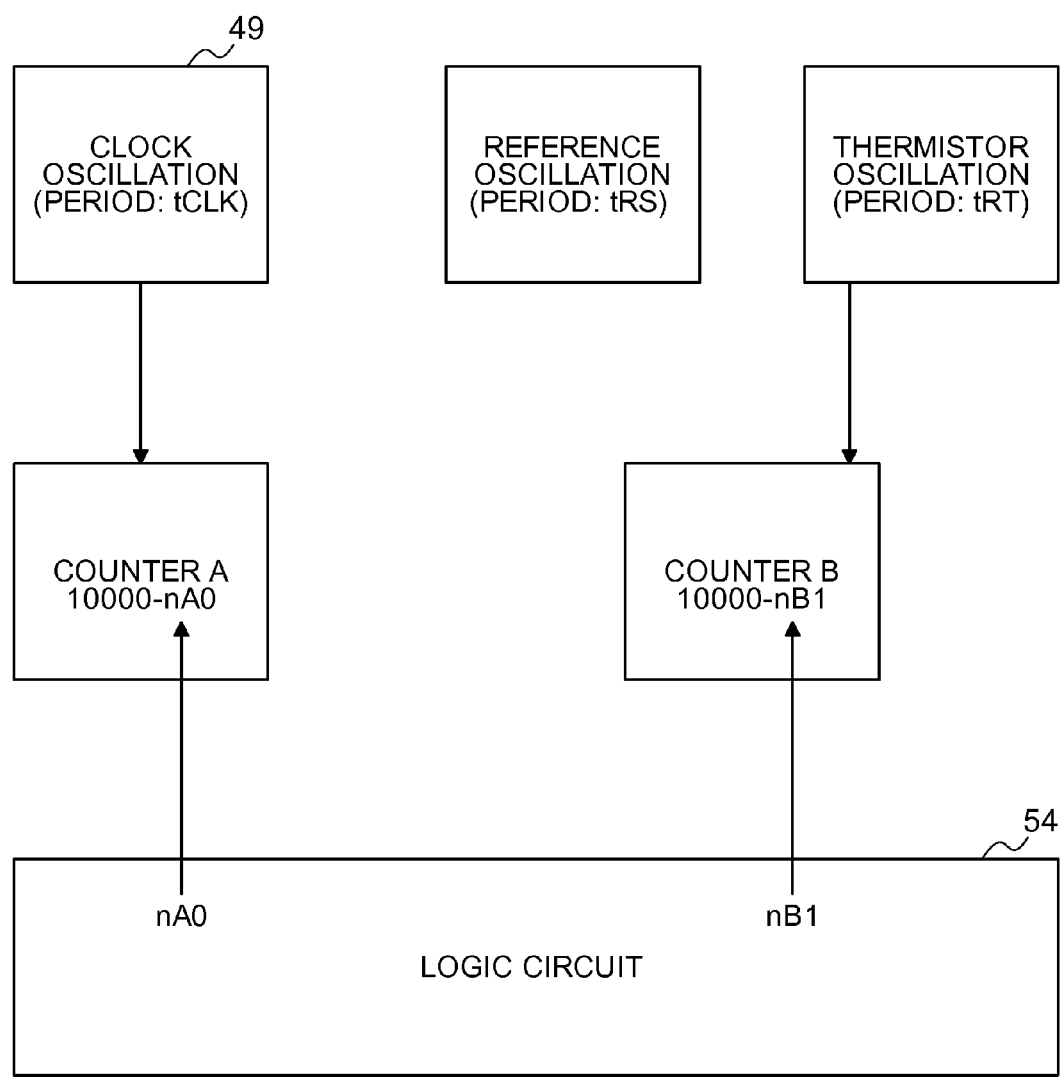
FIG. 13 is a schematic diagram of temperature detection operation by a semiconductor device of the second exemplary embodiment, following on from the operation illustrated in FIG. 12.

Next, the thermistor oscillation is measured with the clock oscillation as the base. Accordingly, each of the counters is set as illustrated in FIG. 13. The counter A that measures the clock oscillation is preset with a value "FFFFH (i.e., the maximum value)"+"1H" (="10000H")−nA0 (i.e., a specific value). Accordingly, in the counter A, overflow occurs when counting has been performed for nA0 cycle counts.

The counter B that measures the reference oscillation is preset with "10000H"−nB1 (i.e., a specific value).

Figure 14:
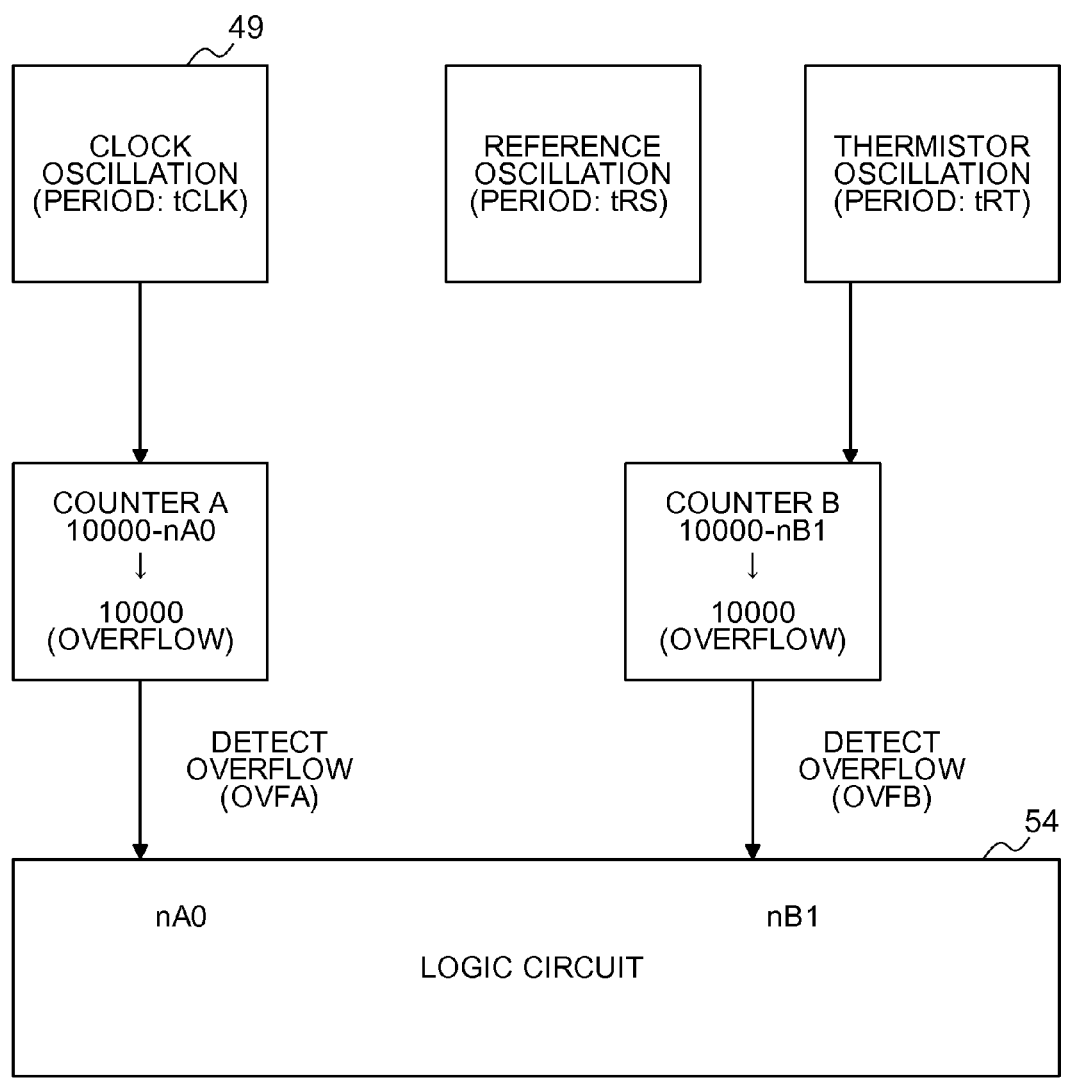
FIG. 14 is a schematic diagram of temperature detection operation by a semiconductor device of the second exemplary embodiment, following on from the operation illustrated in FIG. 13.

Explanation follows regarding the next operation, with reference to the schematic diagram of FIG. 14. Note that FIG. 14 illustrates a state after the thermistor oscillation has been measured with the clock oscillation as the base.

The logic circuit 54 respectively controls the counter A to count the clock oscillation, and the counter B to count the thermistor oscillation. Out of the counter A and the counter B, overflow occurs in the counter in which the count value reaches "10000H" first. When overflow occurs in the counter A, the reference oscillation is faster than the thermistor oscillation. On the other hand, when the overflow occurs in the counter B, the thermistor oscillation is faster than the reference oscillation. When overflow occurs in the counter A and the counter B (this including cases within a permissible range to be treated as being at the same time) at the same time, this means that reference oscillation cycle=thermistor oscillation cycle.

In such cases, the following Formula (7) and Formula (8) is satisfied.

$$nA0 \times tCLK = nB1 \times tRT \qquad \text{Formula (7)}$$

$$tRS = tRT \qquad \text{Formula (8)}$$

As can be understood from Formula (7) and Formula (8), the measurement conditions of the reference oscillation and the thermistor oscillation are the same as to each other.

Thus, overflow occurs first in the counter B when the thermistor oscillation is faster, and overflow occurs first in the counter A when the clock oscillation is faster.

Explanation follows regarding a case in which the reference oscillation is faster than the thermistor oscillation, with reference to the schematic diagrams of FIG. 15 to FIG. 18. In such case, the thermistor oscillation is measured with the clock oscillation as the base (step 202_2 described above), and the reference oscillation is measured with the clock oscillation as the base (step 204_2).

The count value of the thermistor oscillation obtained by measuring the thermistor oscillation with the clock oscillation as the base is employed for performing measurement of the clock oscillation with the reference oscillation as the base. The thermistor oscillation is slower than the reference oscillation. Consequently, when the count value of the slower thermistor oscillation is performed using the faster reference oscillation as the base, the counting finishes earlier.

Namely, the measurement duration to measure the clock oscillation with the reference oscillation as the base is shorter than the measurement duration to measure the thermistor oscillation with the clock oscillation as the base.

Thus, in the present exemplary embodiment, when the clock oscillation is measured with the reference oscillation as the base, the counter A that measures the clock oscillation does not overflow.

Specifically, the following operation is performed.

Figure 15:
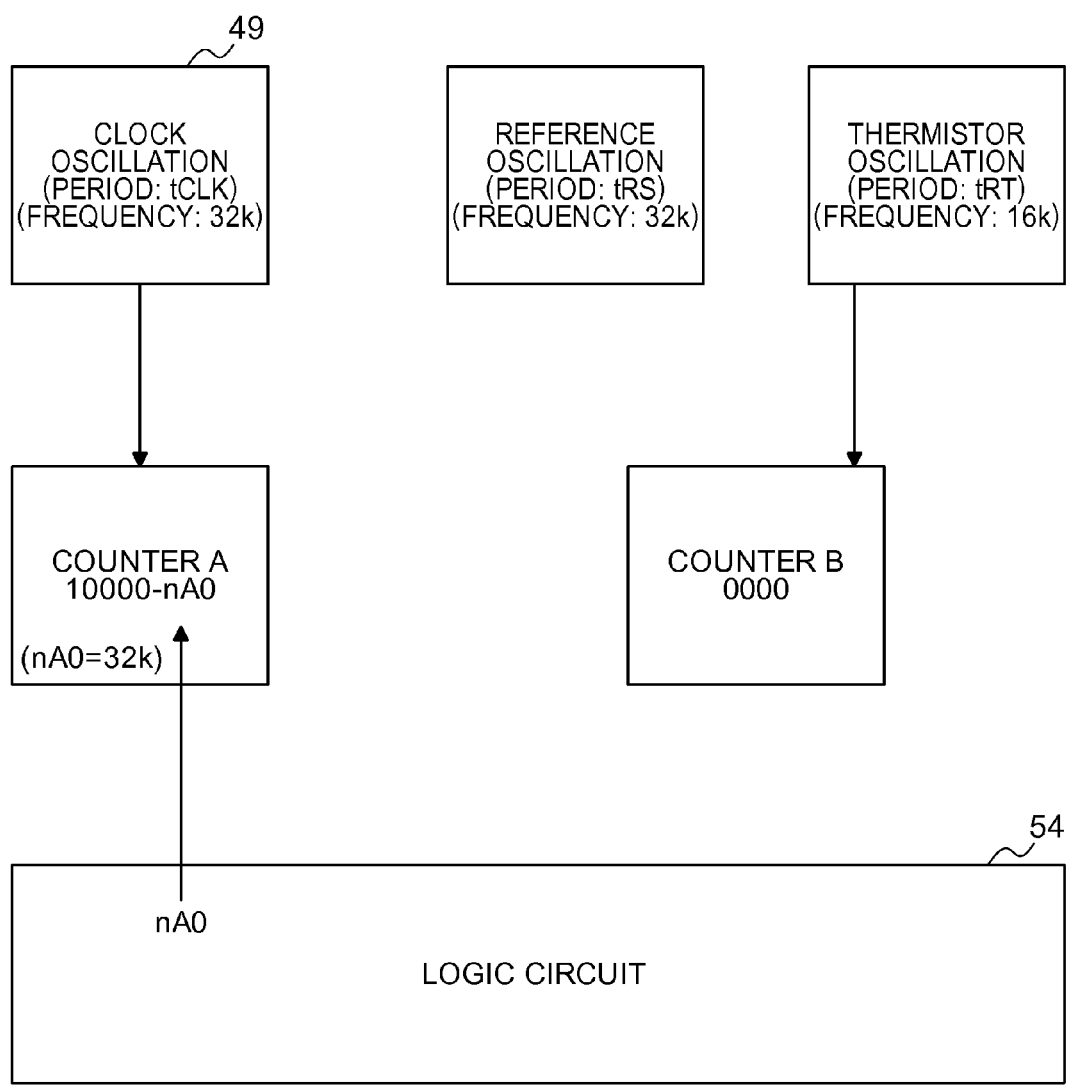
FIG. 15 is a schematic diagram of a temperature detection operation by a semiconductor device of the second exemplary embodiment.

The thermistor oscillation is measured with the clock oscillation as the base. Therefore, each of the counters is set as illustrated in FIG. 15. Note that, example frequencies are given in order to facilitate the understanding of operation of the semiconductor device 10 of the present exemplary embodiment. Moreover, in the present exemplary embodiment, since the recommended operation is as described above, the clock oscillation and the reference oscillation frequency tRS are set the same as to each other. Moreover, measurement duration is set at 1 second, and nA0=32 k times.

The counter A that measures the clock oscillation is preset to a value of "10000H" minus specific value nA0. Thus, overflow occurs in the counter A when nA0 cycle counts have been performed, and the OVFA signal indicating that overflow has occurred is output from the counter A. Note that, as stated above, the specific value nA0 is an arbitrary value.

The counter B that measures the thermistor oscillation is preset with the initial value "0000H".

Figure 16:
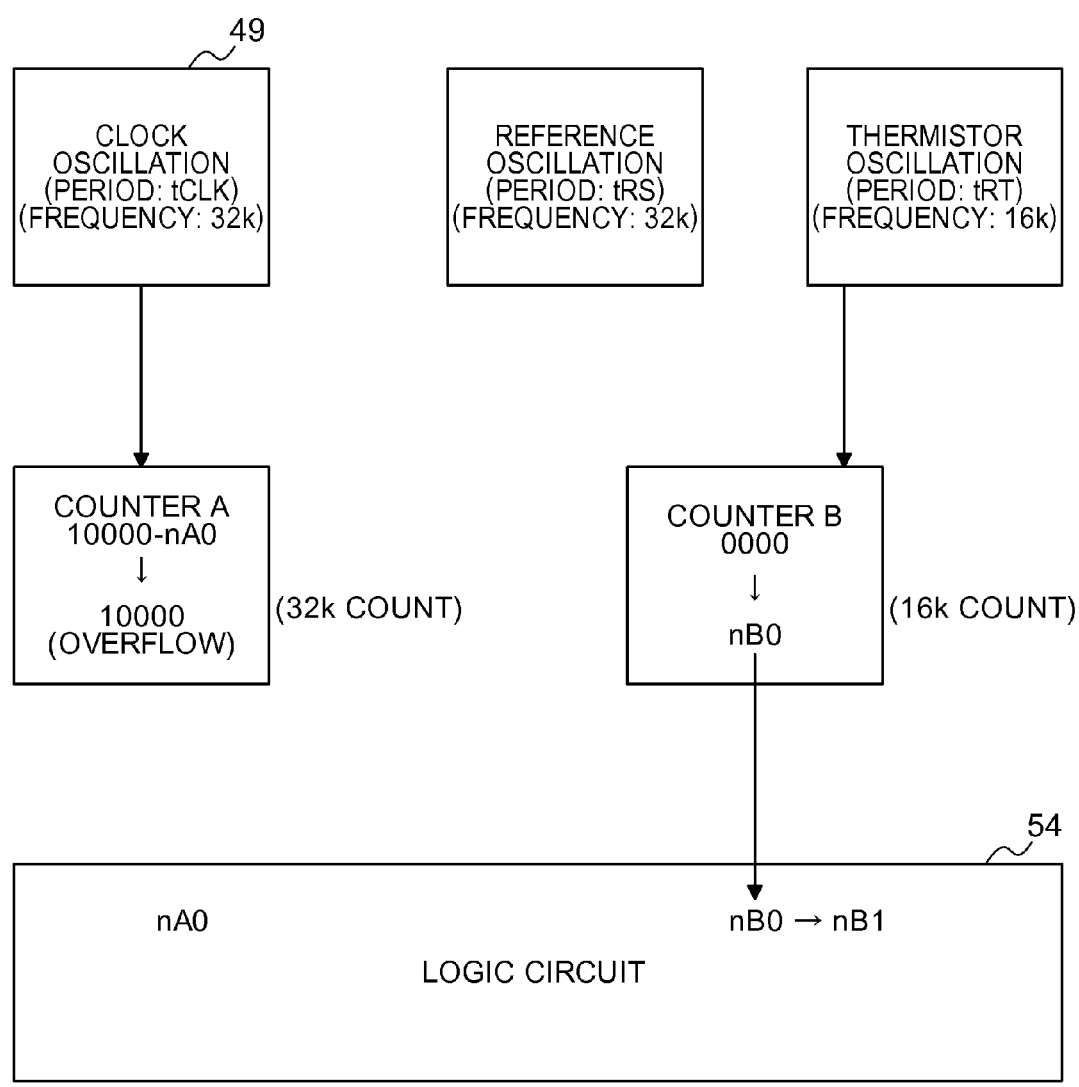
FIG. 16 is a schematic diagram of temperature detection operation by a semiconductor device of the second exemplary embodiment in FIG. 15.

Explanation follows of the next operation, with reference to FIG. 16. Note that FIG. 16 illustrates a state after measurement in which the thermistor oscillation has been measured with the clock oscillation as the base.

The logic circuit 54 respectively starts counting of the clock oscillation in the counter A and the thermistor oscillation in the counter B. When nA0 cycle counts have been performed, the counter A reaches "10000H", overflow occurs, and the OVFA signal is output. In the logic circuit 54, counting in the counter B is stopped based on the counter A interrupt signal output in response to the OVFA signal. The count value of the counter B at this time is set as nB0.

When this occurs, simple design is enabled by making the reference oscillation and the clock oscillation about the same speed as each other. Accordingly, the reference oscillation and the clock oscillation are set at the same frequency. When this occurs, the thermistor oscillation is slower than the clock oscillation. Accordingly, overflow does not occur in the counter B that counts the thermistor oscillation. The clock oscillation may also be employed in place of the reference oscillation.

In the logic circuit 54, the nB0 is stored in the memory. The nB0 stored in the memory is set as nB1. Namely, becomes nB0=nB1.

In such cases, the following Formula (9) and Formula (10) is satisfied.

$$nA0 \times tCLK = nB0 \times tRT \qquad \text{Formula (9)}$$

$$nB1 = nA0 \times (tCLK/tRT) \qquad \text{Formula (10)}$$

Figure 17:
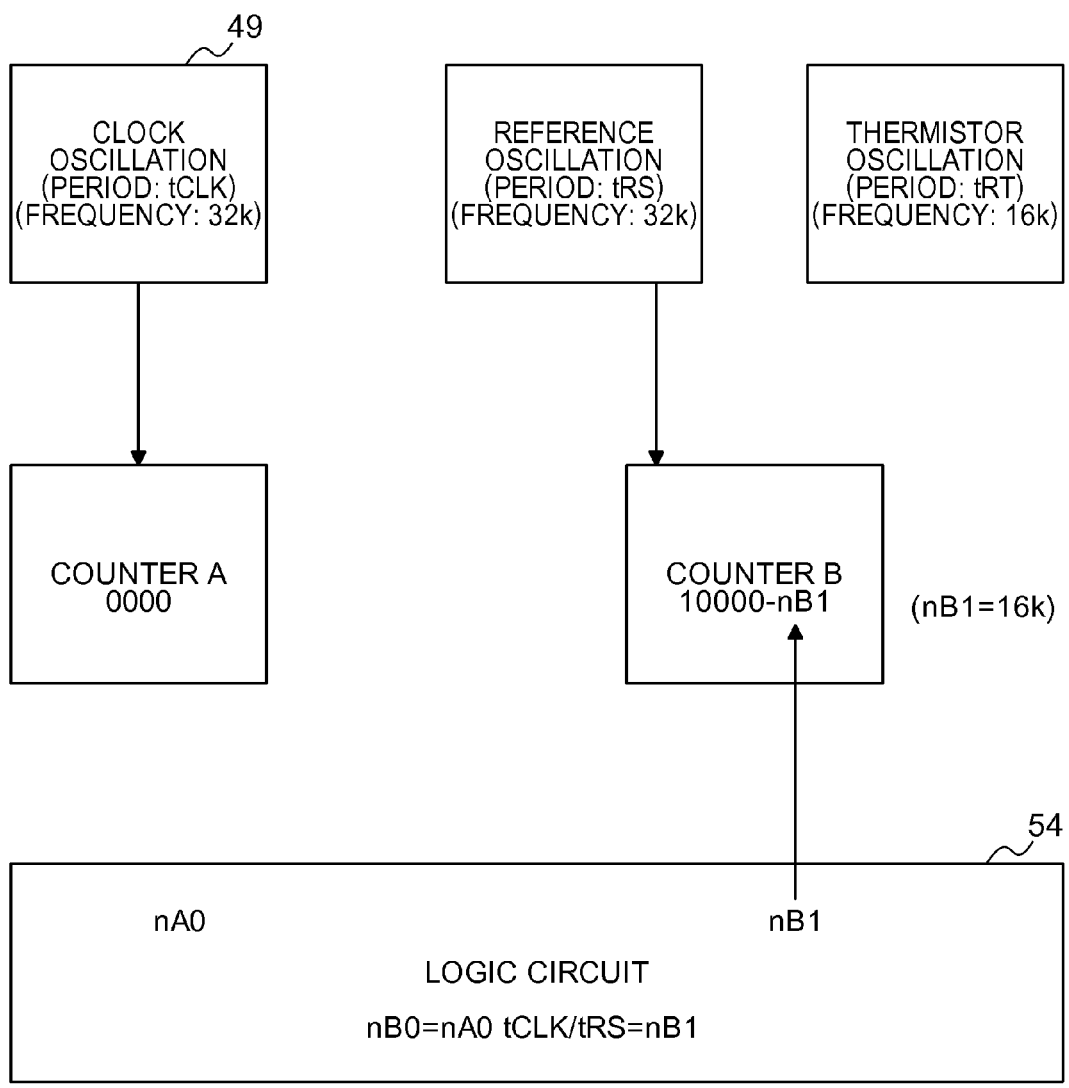
FIG. 17 is a schematic diagram of temperature detection operation by a semiconductor device of the second exemplary embodiment, following on from the operation illustrated in FIG. 16.

Next, the reference oscillation is measured with the clock oscillation as the base. Accordingly, each of the counters is set as illustrated in FIG. 17. The counter A that measures the clock oscillation is preset with an initial value of "0000H". The counter B that counts the reference oscillation is preset with a value in which a specific value nB1 has been subtracted from "10000H". Thus, when the counter B has counted nB1 cycle, overflow occurs in the counter B.

The logic circuit 54 respectively controls the counter A to count the clock oscillation, and the counter B to count the reference oscillation.

Figure 18:
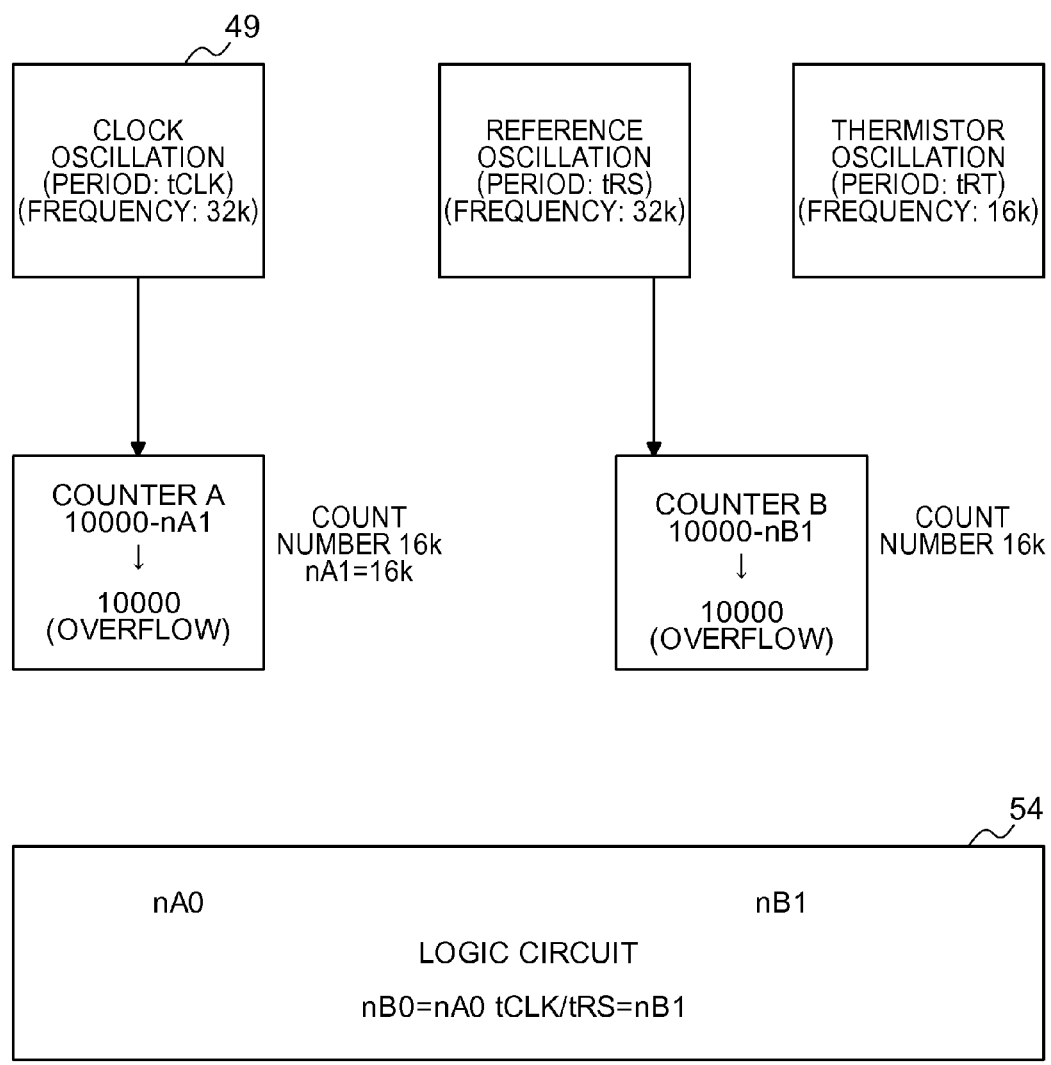
FIG. 18 is a schematic diagram of temperature detection operation by a semiconductor device of the second exemplary embodiment, following on from the operation illustrated in FIG. 17.

Explanation follows regarding the next operation, with reference to FIG. 18. Note that FIG. 18 illustrates a state after measurement in which the reference oscillation has been measured with the clock oscillation as the base.

A count value nA1 of the counter A is obtained when the counter B overflows. When this occurs, as described above, the measurement duration becomes shorter since the count value of the slower thermistor oscillation is measured using the faster reference oscillation. Accordingly, overflow does not occur in the counter A.

In this case, the following Formula (11) is satisfied.

$$nA1 \times tCLK = nB1 \times tRS \qquad \text{Formula (11)}$$

Further, by substituting Formula (10) in Formula (11), Formula (12) is satisfied.

$$nA1 = nA0 \times (tRS/tRT) \qquad \text{Formula (12)}$$

Since nA0 is a known specific value, it can be treated here as a constant value. Therefore, practically, the frequency ratio: tRS/tRT (namely, the frequency ratio between the reference oscillation and the thermistor oscillation) can be obtained from Formula (12).

As illustrated in FIG. 15 to FIG. 18, in a specific example of the present exemplary embodiment, nA0 is set as 32 k, and nA1 is set as 16 k. Consequently, in the present exemplary embodiment, becomes, nA1/nA0=tRS/tRT=1/2. This indicates that the ratio of tRS/tRT is 1/2.

Note that, frequency=1/cycle, and as stated above, the frequency of the reference oscillation is 1/tRS, and the frequency of the thermistor oscillation is 1/tRT. Thus, due to frequency being inverse of the cycle, tRS/tRT=1/2 means that, the reference oscillation frequency tRS is twice as high (fast) as the thermistor oscillation frequency tRT.

Explanation next follows regarding cases in which the thermistor oscillation is faster than the reference oscillation. Note that schematic diagrams thereof are omitted since they are substantially the same as in cases described above in which the reference oscillation is faster than the thermistor oscillation.

In such cases, the clock oscillation is measured with the reference oscillation as the base (step 202_1), and the thermistor oscillation is measured with the clock oscillation as the base (step 204_1).

The measurement of the clock oscillation the thermistor oscillation as the base is performed by using count value of the reference oscillation obtained by measurement of the reference oscillation with the clock oscillation as the base. The reference oscillation is slower than the thermistor oscillation. Accordingly, counting can be finished earlier by counting the count value of the slower reference oscillation using the faster thermistor oscillation as the base.

Namely, the duration to measure the clock oscillation with the thermistor oscillation as the base, is shorter than the duration to measure the reference oscillation with the clock oscillation as the base.

Therefore, in the present exemplary embodiment, when the clock oscillation is measured with the thermistor oscillation as the base, there is the advantage that the counter A that measures the clock oscillation does not overflow.

Specifically, the following operation is performed.

The reference oscillation is measured with the clock oscillation as the base. The counter A that measures the clock oscillation is preset to a value of "10000H" minus a specific value nA0. Thus, overflow occurs in the counter A when nA0 cycle counts have been performed, and the OVFA signal indicating that overflow has occurred is output from the counter A. Note that, as stated above, the specific value nA0 is an arbitrary value.

The counter B that measures the reference oscillation is preset with the initial value "0000H".

Further, the logic circuit 54 respectively controls the counter A to start counting of the clock oscillation, and the counter B to start counting of the reference oscillation. When nA0 cycle counts have been performed, the counter A reaches "10000H", overflow occurs, and the counting in the counter B is stopped. The count value of the counter B at this time is set as nB0.

In such case, by configuring the reference oscillation and the clock oscillation to be about the same speed to each other, simple design may be enabled. For example, in a case in which the reference oscillation and the clock oscillation are set to be the same frequency, since the counter B does not overflow when the counter A performs nA0 cycle counts, design difficulties may be reduced, and the design may become simple. The clock oscillation may also be employed in place of the reference oscillation.

In the logic circuit 54, the nB0 is stored in the memory. The nB0 stored in the memory is set as nB1. Namely, becomes nB0=nB1.

In such cases, the following Formula (13) and Formula (14) is satisfied.

$$nA0 \times tCLK = nB0 \times tRS \qquad \text{Formula (13)}$$

$$nB1 = nA0 \times (tCLK/tRS) \qquad \text{Formula (14)}$$

Next, the thermistor oscillation is measured with the clock oscillation as the base. The counter A that measures the clock oscillation is preset with an initial value "0000H". Further, the counter B that counts the thermistor oscillation is preset with a value in which the specific value nB1 has been subtracted from "10000H". Thus, the counter B overflows when nB1 cycle have been counted.

The logic circuit 54 respectively controls the counter A to count the clock oscillation, and the counter B to count the thermistor oscillation.

In the logic circuit 54, a count value nA1 of the counter A is obtained when the counter B overflows. When this occurs, as described above, the count value of the slower thermistor oscillation is measured by the faster reference oscillation, and so the measurement duration becomes shorter. Accordingly, overflow does not occur in the counter A.

In this case, the following Formula (15) is satisfied.

$$nA1 \times tCLK = nB1 \times tRT \qquad \text{Formula (15)}$$

Further, by substituting Formula (14) in Formula (15), the following Formula (16) is also satisfied.

$$nA1 = nA0 \times (tRT/tRS) \qquad \text{Formula (16)}$$

Since nA0 is a known specific value, it can be treated here as a constant value. Therefore, practically, the frequency ratio: tRT/tRS, (namely, the frequency ratio between the thermistor oscillation and the reference oscillation) can be obtained from Formula (16).

As illustrated in FIG. 15 to FIG. 18, in a specific example of the present exemplary embodiment, nA0 is set as 32 k, and nA1 is set as 16 k. Consequently, in the present exemplary embodiment, becomes nA1/nA0=tRS/tRT=1/2. This indicates that the ratio of tRS/tRT is 1/2.

Note that, frequency=1/cycle, and as stated above, the frequency of the reference oscillation is 1/tRS, and the frequency of the thermistor oscillation is 1/tRT. Thus, tRS/tRT=1/2 means that, due to frequency being the inverse of the cycle, the reference oscillation frequency tRS is twice as high (fast) than the thermistor oscillation frequency tRT.

As stated above, when the reference oscillation is the faster, nA1=nA0×(tRS/RT) in Formula (12) can be obtained. On the other hand, when the thermistor oscillation is the faster, nA1=nA0 (tRT/RS) in Formula (16) can be obtained. Thus, in the present exemplary embodiment, the frequency ratio tRS/tRT is inverted, according to which of the reference oscillation or the thermistor oscillation is the faster. An inversion point is where the frequency of the reference oscillation and the frequency of the thermistor oscillation are equivalent to each other, at, for example, the point where tRS=tRT.

Thus, in the present exemplary embodiment, a table pre-stored in the ROM 46 includes a region indicating correspondence relationships between frequency ratio and temperature in which nA1=nA0×(tRS/tRT), and a region indicating correspondence relationships between frequency ratio and temperature in which nA1=nA0×(tRT/tRS). Note that, regarding provision of two regions indicating correspondence relationships between frequency ratio and temperature in the table that is stored in the ROM 46, this may be accomplished similarly to in the first exemplary embodiment.

Moreover, in a case in which, whether the reference oscillation or the thermistor oscillation is faster is determined by using the above determination result, and when the reference oscillation is the faster, the region nA1=nA0 (tRS/tRT) is referred to. However, when the thermistor oscillation is the faster, the region nA1=nA0 (tRT/tRS) is referred to. The logical multiplication/division circuit 50 refers to this table, acquires the corresponding temperature, and outputs the acquired temperature to the display device 14.

The semiconductor device 10 of the present exemplary embodiment accordingly determines the faster oscillation out of the reference oscillation or the thermistor oscillation counted by the counter B with reference to the clock oscillation counted by the counter A. Further, the slower oscillation out of the reference oscillation or the thermistor oscillation is measured with the clock oscillation as the base. The reference oscillation is measured with the clock oscillation as the base, when the thermistor oscillation is the faster. The thermistor oscillation is measured with the clock oscillation as the base when the reference oscillation is the faster. Then, the clock oscillation is measured using the faster out of the reference oscillation or the thermistor oscillation as the base. The clock oscillation is measured with the thermistor oscillation as the base when the thermistor oscillation is the faster. On the other hand, the clock oscillation is measured with the reference oscillation as the base when the reference oscillation is the faster.

In the present exemplary embodiment, since the oscillation that is counted as the base counter is always the faster (or same speed) oscillation, configuration can be made such that overflow does not occur in other counter that counts the slower oscillation. Consequently, overflow in the counter A and the counter B may be suppressed in whichever cases (whichever oscillation is the faster), enabling high precision measurement to be performed.

Moreover, even when the nA0 value is larger due to the reference oscillation frequency and the clock oscillation frequency being about the same, overflow is avoided in whichever cases, enabling both high precision measurement to be performed and also design to be simplified. The clock oscillation may also be employed in place of the reference oscillation.

Moreover, the present exemplary embodiment may enable the measurement precision to be increased by increasing the count length (maximum value of the counter) right up to the count value of the base counter, and thereby increasing the count value.

Consequently, the semiconductor device 10 according to the present exemplary embodiment may perform high precision measurement over a wide range.

Note that, in the present exemplary embodiment, a case in which the table indicating correspondence relationships between frequency ratio and temperature includes two regions, have been described. However, there is no limitation thereto. As in the first exemplary embodiment, configuration may be made so as to change the Formula for computing the frequency ratio, when the reference oscillation is faster or when the thermistor oscillation is faster. For example, configuration may be made such that nA1/nA0=tRS/tRT is computed when the reference oscillation is faster, and nA0/nA1=tRS/tRT is computed when the thermistor oscillation is faster. In such cases, configuration may be made such that the table expressing the correspondence relationships between frequency ratio and temperature is provided only with a region indicating correspondence relationships between frequency ratio: tRS/tRT and temperature. However, in such case, a multiplication/division circuit may be required in the logic circuit 54, similarly to in the first exemplary embodiment.

Comparative Example

Explanation follows regarding temperature measurement using a semiconductor device employing a conventional RC circuit as a Comparative Example. FIG. 26 to FIG. 29 are schematic diagrams illustrating semiconductor devices that perform temperature measurement using a semiconductor device employing a conventional RC circuit as a Comparative Example. A counter A and a counter B are, similarly to in each of the above exemplary embodiments, 16 Bit counters. Similarly to in each of the above exemplary embodiments, the cycle of a reference oscillation is denoted as tRS, the cycle of a thermistor oscillation is denoted as tRT, and the cycle of a clock oscillation is denoted as tCLK. In the semiconductor device of the Comparative Example, temperature is measured by a logic circuit 150 based on the clock oscillation, the reference oscillation and the thermistor oscillation.

Explanation next follows regarding temperature detection operation of the conventional semiconductor device.

Figure 26:
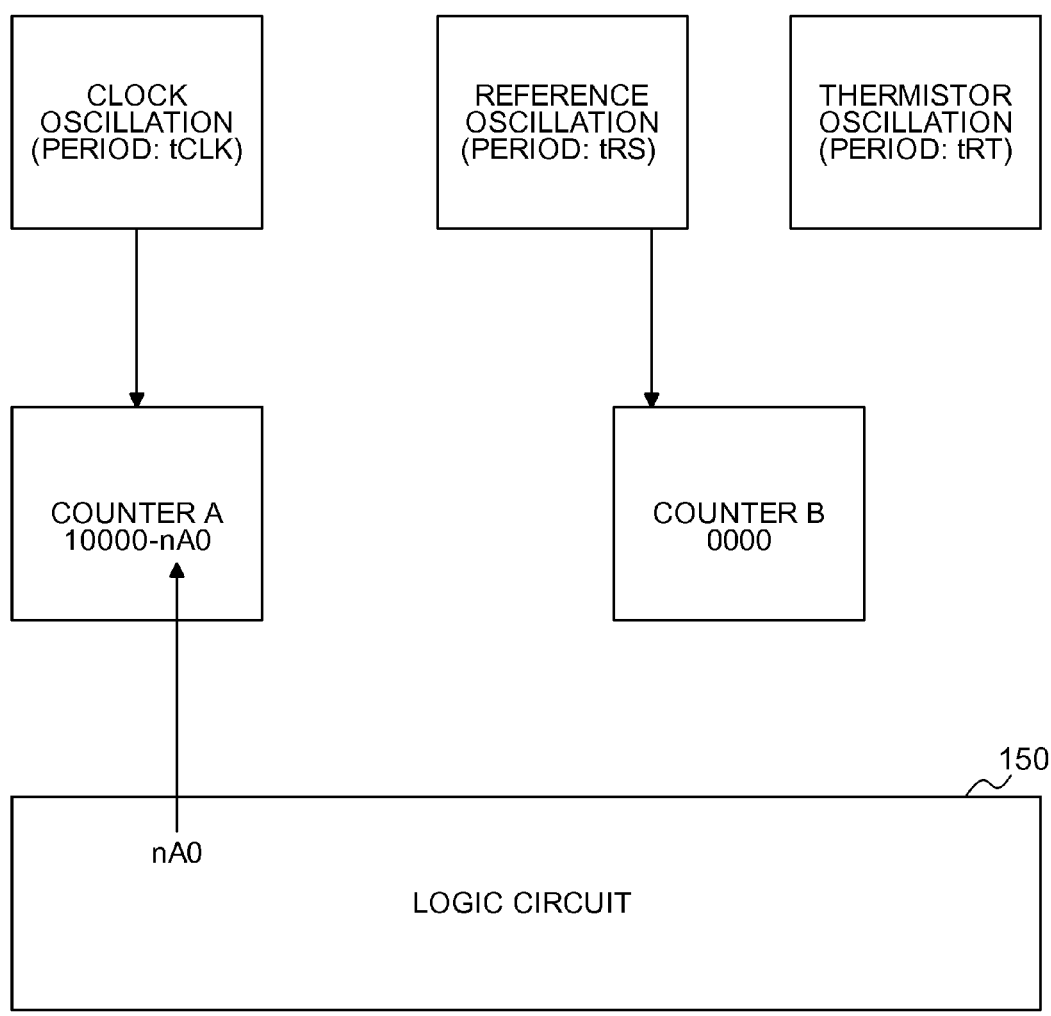
FIG. 26 is a schematic diagram by a semiconductor device that performs temperature measurement employing a conventional RC circuit.

First, as illustrated in FIG. 26, the counter A is preset with a value of "FFFFH (the maximum value)"+"1H" (="10000H")−nA0 (a specific value). The counter A accordingly overflows when nA0 cycle of counts have been performed from count start.

The counter B is preset with an initial value of "0000H".

The logic circuit 150 controls the counter A to start counting the clock oscillation and the counter B to start counting the reference oscillation.

Figure 27:
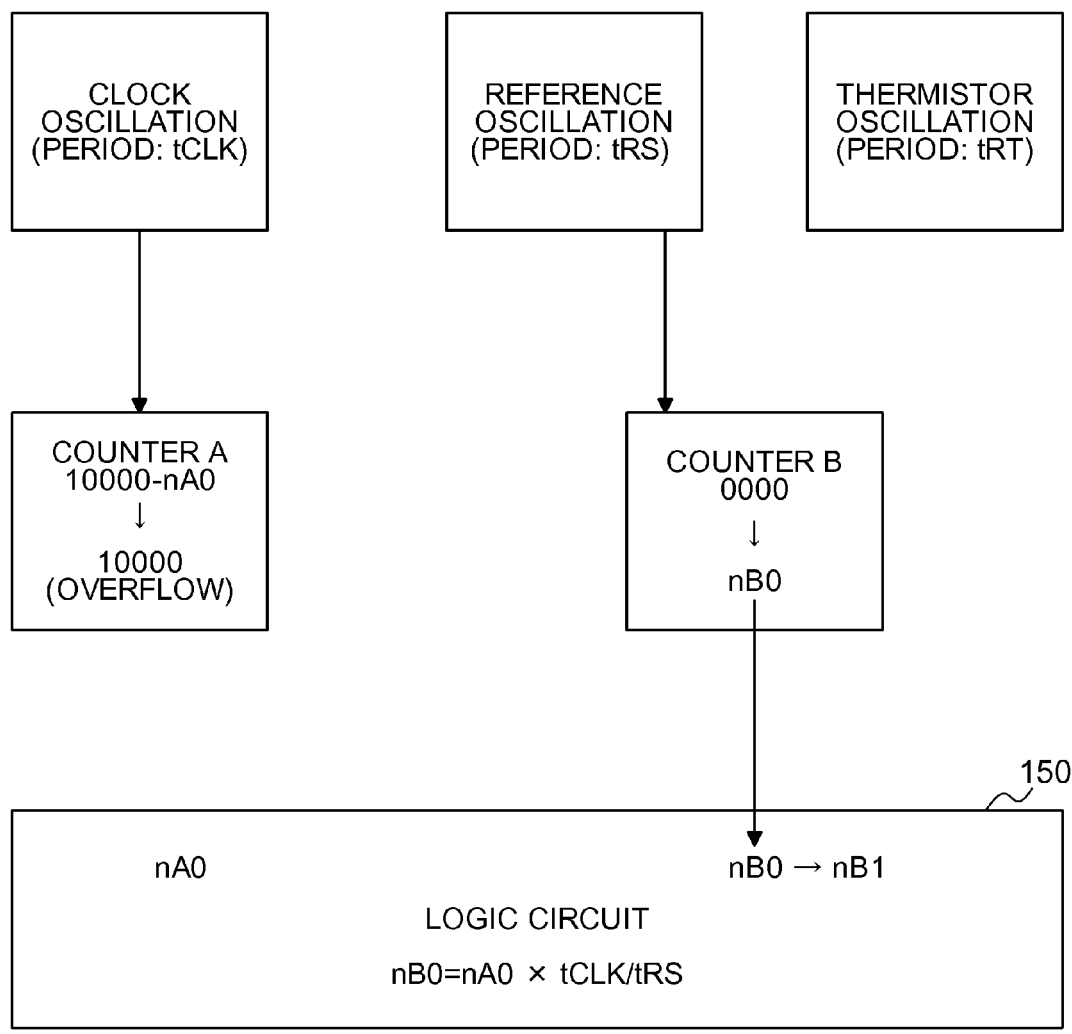
FIG. 27 is a schematic diagram illustrating a temperature detection operation of a conventional semiconductor device.

Then, as illustrated in FIG. 27, the counting of the counter A and the counter B is ended (stopped) at a timing when the counter A has overflowed. The logic circuit 150 reads the counter value nB0 of the counter B at this time, and temporarily stores this in the memory. The logic circuit 150 sets stored nB0 as a count value nB1 (nB0=nB1).

Explanation follows regarding the relationship between nB0 and nA0 at this point.

In the conventional semiconductor device, clock oscillation count value×clock oscillation cycle=reference oscillation count value×reference oscillation cycle, which in this case is nB0×tRs=nA0×tCLK. From which nB0=nA0×tCLK/tRS can be derived.

Figure 28:
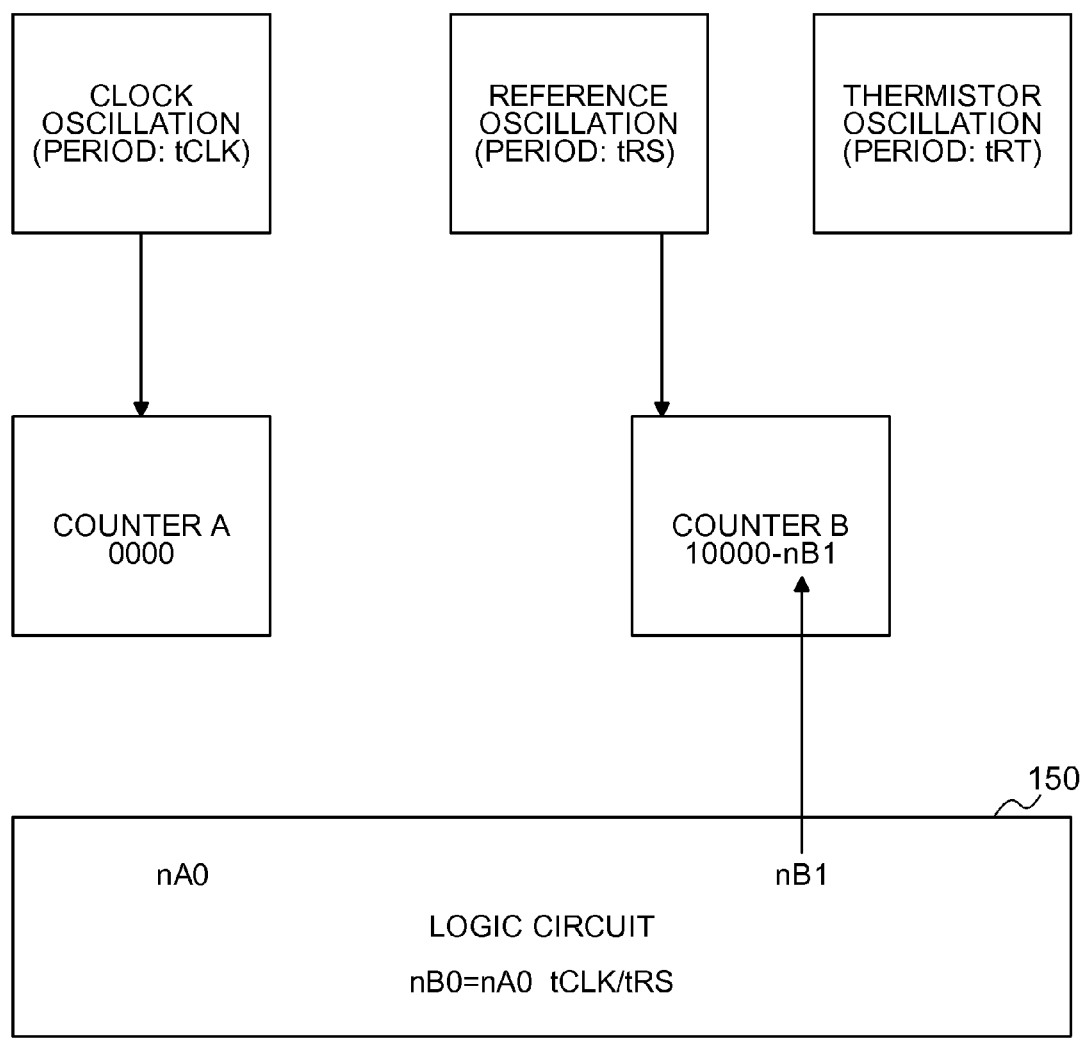
FIG. 28 is a schematic diagram of temperature detection operation by a conventional semiconductor device, following on from the operation illustrated in FIG. 27.

Next, as illustrated in FIG. 28, the counter A is preset with an initial value "0000H". The counter B is preset with a value in which a count value nB1 has been subtracted from "10000H". Note that, the count value nB1 is the same value as nB0, however weighting thereof may also be performed.

The counter A counts the clock oscillation. The counter B counts the thermistor oscillation.

Figure 29:
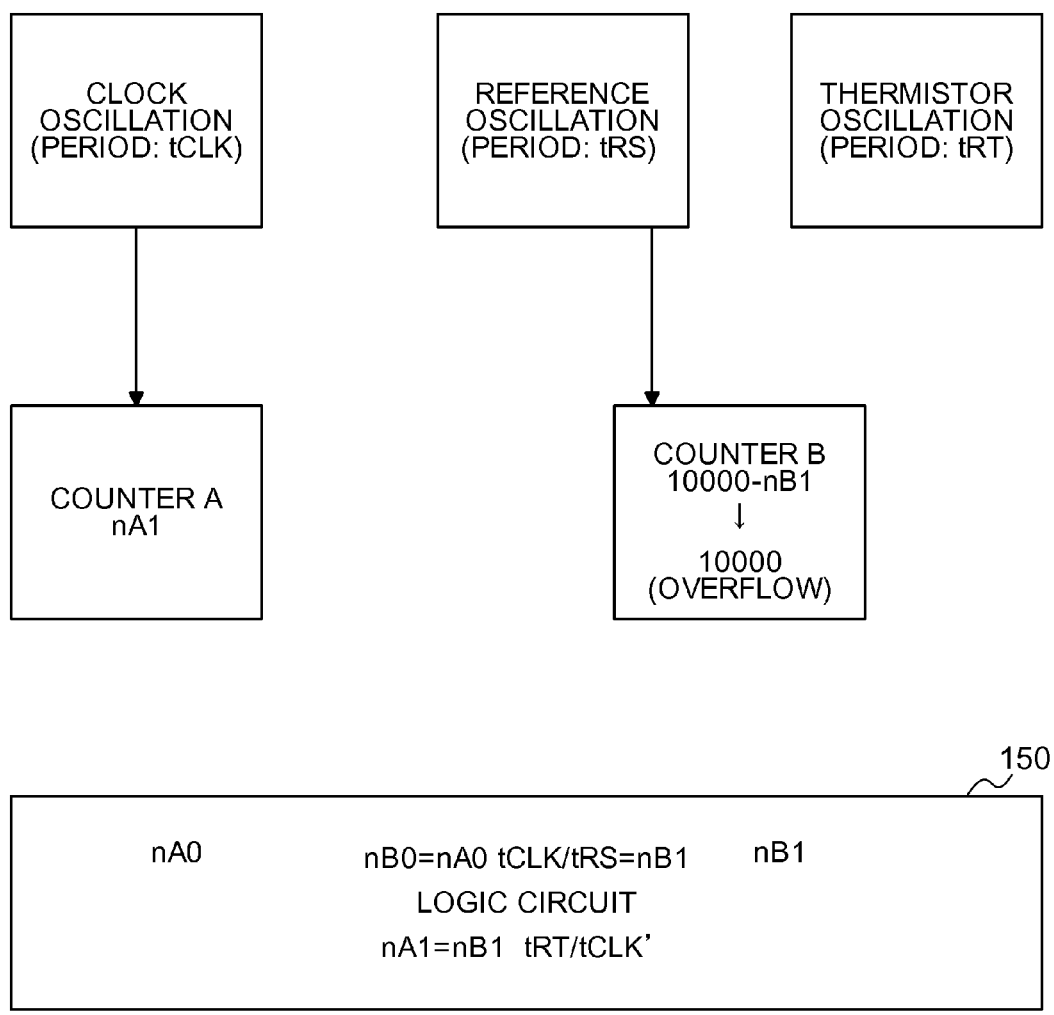
FIG. 29 is a schematic diagram of temperature detection operation by a conventional semiconductor device, following on from the operation illustrated in FIG. 28.

Next, as illustrated in FIG. 29, the count value nA1 of the counter A is read at a timing when the counter B overflows. As described above, in the conventional semiconductor device, since nB0×tRs=nA0×tCLK, nA1=nB1×tRT/tCLK can be derived. Here, by substituting nB1=nB0 into this Formula, becomes nA1=nA0×tRT×tCLK/tCLK/tRS. By Simplifying this Formula, becomes, nA1/nA0=tRT/tRS.

Namely, the ratio of the count value nA1 and the specific value nA0 is equal to, the ratio of the thermistor oscillation and the reference oscillation, namely, the oscillation frequency ratio.

Semiconductor device measurement devices using RC oscillator circuits are often employed for a wide range of measurements. However, in such cases, the following cases may occur in the conventional semiconductor devices.

When a thermistor resistor is employed in the RC oscillator circuit, the thermistor resistor has a smaller resistance value at high temperature, and in contrast, has a greater resistance value at low temperature. Therefore, when the range of temperature for measuring is wide, variation in the resistance value becomes large.

For example, in a case in which an extremely high temperature is to be measured, when operation is performed as illustrated in FIG. 28, the thermistor oscillation is counted by the counter B which is preset with a value of "10000H" minus nB1. At high temperature, the thermistor resistor has a lower resistance value, and therefore, the thermistor oscillation is faster (high frequency). Accordingly, overflow occurs soon in the counter B. This means that the count number in the counter A, that started at the same time as the counter B, is smaller.

In the conventional semiconductor device, the oscillation frequency ratio used in actual temperature measurement is nA1/nA0, however, measurement precision may not be achieved (desired measurement precision may not be obtained) due to the small count number of the nA1. Generally, the count number and the temperature measurement precision have approximately proportional relationship to each other. Thus, in order to perform high precision measurement at high temperature, nB1 of "10000H"−nB1 (namely, the value preset in the counter B) needs to be large. Note that, the nB1 can be made larger by using a weighting (for example multiplying by a specific value), or by making nA0 large, however, since it is not possible to exceed the maximum count value of the counter B, there are limitations thereto.

As an opposite case, in a case in which an extremely low temperature is to be measured, when operation is performed as illustrated in FIG. 28, the thermistor oscillation is counted by the counter B which is preset with "10000H"−nB1. At the low temperature, the thermistor resistor has a higher resistance value, and so the thermistor oscillation becomes slower (lower frequency). Overflow does not readily occur in the counter B. This means that, overflow occurs in the counter A that has been started at the same time as the counter B. Note that, when such overflow occurs in the counter A, measurement cannot be obtained with the conventional measurement method.

Namely, in the conventional semiconductor device, the oscillation frequency ratio used in actual temperature measurement is nA1/nA0. However, since nA1 overflow, the measurement may not be able to be performed. Thus, in order to perform measurement at low temperature, nB1 in the value "10000H"−nB1, which is preset in the counter B, needs to be made smaller. The nB1 can be made smaller by using weighting (for example multiplying by a specific value), and by making nA0 small. Further, the bit number of counter A also needs to be high such that overflow nA1 does not cause overflow.

When measuring at low temperature in this manner, a small weighting may be applied to the nB1 in order prevent overflow in counter A. However, since nA0 is small, the measurement precision cannot be ensured for measuring at high temperature. Accordingly, it is extremely difficult to perform measurement over a wide range with a conventional semiconductor device.

In contrast thereto, in the semiconductor device 10 of the present invention as explained in each of the above exemplary embodiments, determination is made as to which is faster out of the reference oscillation or the thermistor oscillation, and measurement is then performed according to the determination result. Accordingly, overflow that may occur in the conventional semiconductor device does not occur in either the counter A or the counter B, in a case in which the temperature is measured both at high temperature and low temperature. Moreover, since the count value can be made large, measurement may be performed with high precision. Consequently, the semiconductor device 10 of the present invention may perform high precision measurements over a wide range.

[Third Exemplary Embodiment]

In the first exemplary embodiment and the second exemplary embodiment, cases in which the thermistor 20, the reference resistor 22, the capacitor 24, and the capacitor 26 of the RC oscillator circuit 12 are disposed externally to the semiconductor device 10, have been described.

The thermistor 20, the reference resistor 22, the capacitor 24, and the capacitor 26 of the RC oscillator circuit 12 are disposed externally in the first exemplary embodiment and the second exemplary embodiment, since incorporating the thermistor 20 into an LSI chip (the semiconductor device 10) is difficult.

Explanation follows regarding a case in the present exemplary embodiment in which the whole of an RC oscillator circuit 12 is provided internally to the semiconductor device 10.

Figure 19:
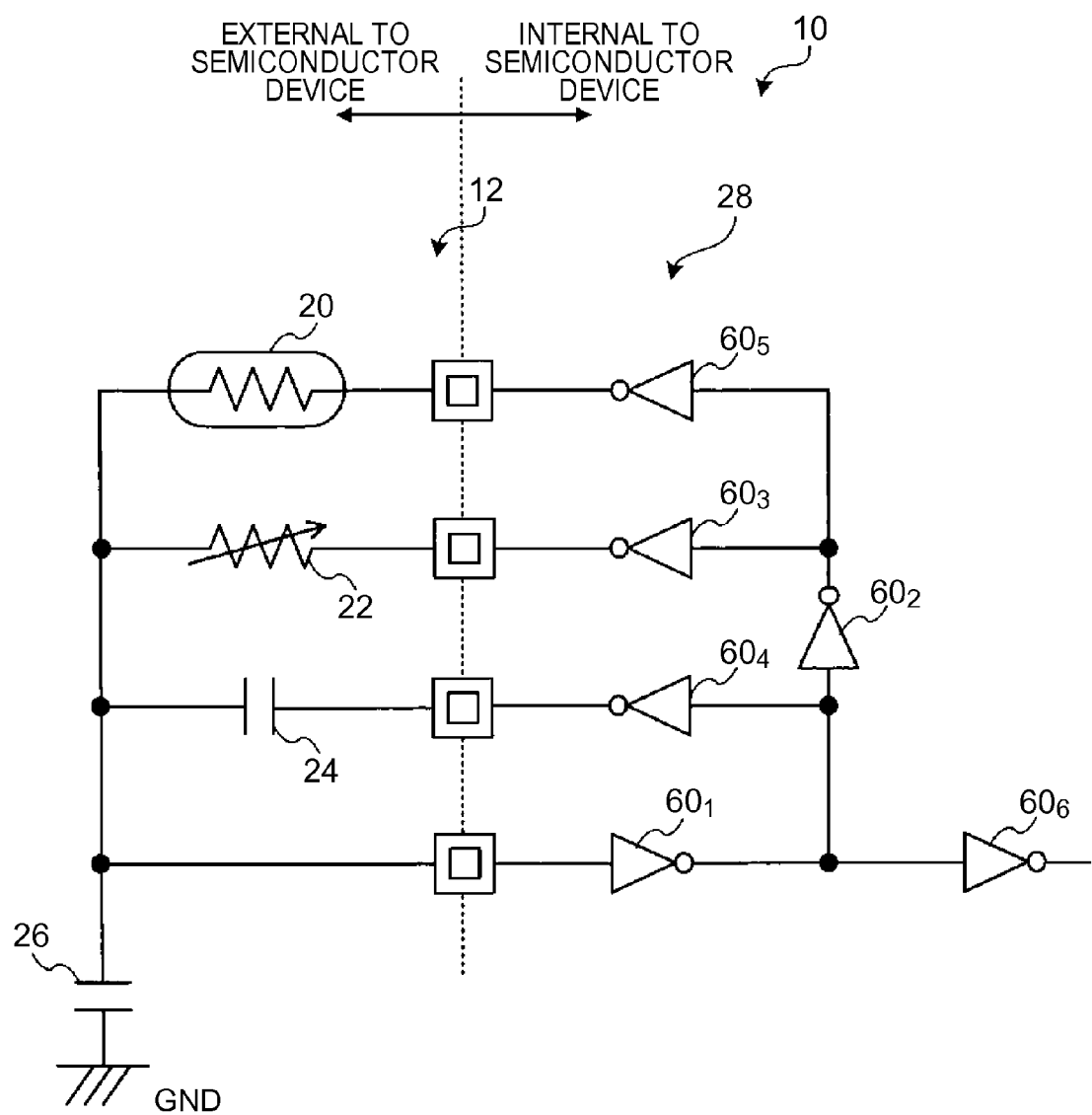
FIG. 19 is a circuit diagram of an RC oscillator circuit in a case in which a thermistor, a reference resistor, a capacitor and an another capacitor are externally provided.

First, FIG. 19 illustrates a circuit diagram of an example of an RC oscillator circuit 12 when, as in the first exemplary embodiment and the second exemplary embodiment, a thermistor 20, a reference resistor 22, a capacitor 24 and a capacitor 26 are provided externally.

As illustrated in FIG. 19, the RC oscillator circuit 12 includes the thermistor 20, the reference resistor 22, the capacitor 24, the capacitor 26 and plural inverters 60 ($60_1$ to $60_6$). The plural inverters 60 ($60_1$ to $60_6$) correspond to the oscillator circuit 28. Note that, in FIG. 19, same inverter circuits are employed as the plural inverters 60 ($60_1$ to $60_6$).

The inverted output of the inverter $60_5$ is connected to the thermistor 20. The inverted output of the inverter $60_3$ is connected to the reference resistor 22. The inverted output of the inverter $60_4$ is connected to one electrode of the capacitor 24. The input of the inverter $60_1$ is connected to one electrode of the capacitor 26.

Further, one end of the capacitor 26 is connected to the thermistor 20, the reference resistor 22, the capacitor 24 and the inverter $60_1$, and the other end of the capacitor 26 is connected to ground. Note that, ground may be any specific voltage and is not limited to 0V.

Moreover, the input of the inverter $60_2$ is connected to the inverted output of the inverter $60_1$ and to the input of the inverter $60_4$, and the inverted output of the inverter $60_2$ is connected to the inputs of the inverter $60_5$ and the inverter $60_3$.

In order to output a reference oscillation, the RC oscillator circuit 12 outputs an RC oscillation, arising through the reference resistor 22 and the capacitor 24, and the reference resistor 22 and the capacitor 26, as the reference oscillation, when the inverter $60_5$ is placed in a high impedance state. Further, in order to output a thermistor oscillation, the RC oscillator circuit 12 outputs an RC oscillation, arising through the thermistor 20 and the capacitor 24, and the thermistor 20 and the capacitor 26, as the thermistor oscillation, when the inverter $60_3$ is placed in a high impedance state.

Figure 20:
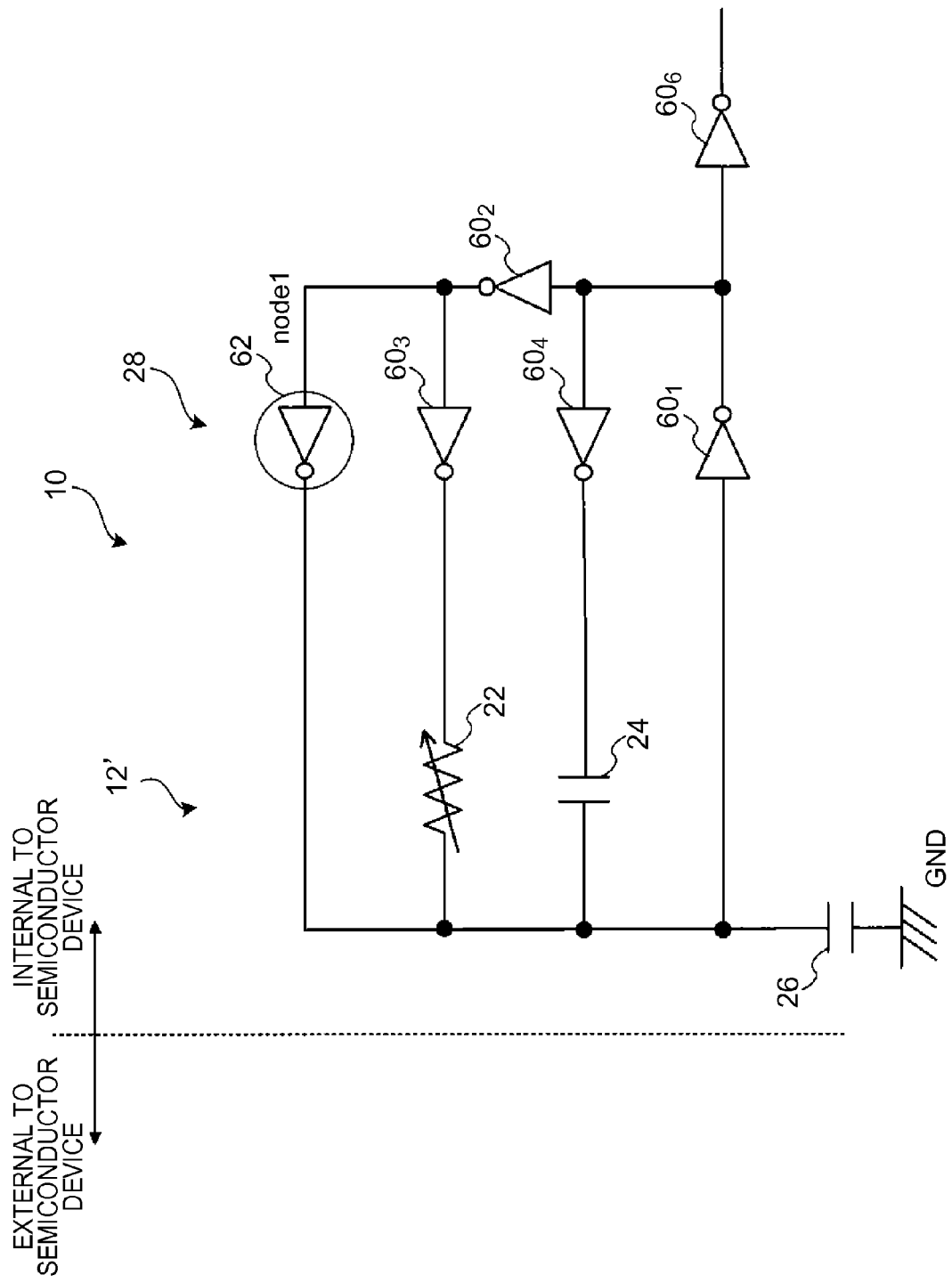
FIG. 20 is a circuit diagram of an RC oscillator circuit 12 of a third exemplary embodiment.

FIG. 20 illustrates an example of a circuit diagram of a RC oscillator circuit 12' of the present exemplary embodiment. The entire RC oscillator circuit 12' of the present exemplary embodiment is, as stated above, provided internally to the semiconductor device 10.

The RC oscillator circuit 12' of the present exemplary embodiment, in comparison to the RC oscillator circuit 12 illustrated in FIG. 19, includes sensor inverters 62 in place of the thermistor 20 and the inverter 60.

Figure 21:
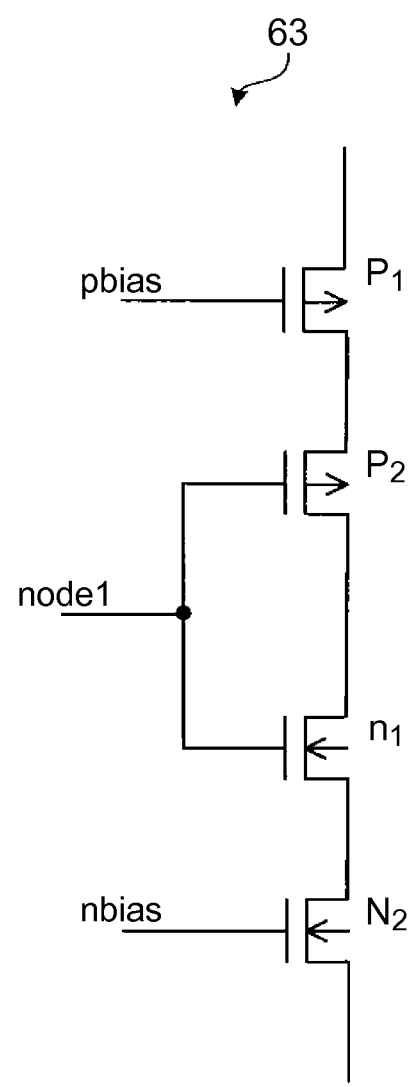
FIG. 21 is a circuit diagram of an inverting section of a sensor inverter of an RC oscillator circuit of the third exemplary embodiment.

The sensor inverter 62 of the present exemplary embodiment includes an inverting section 63 and a bias circuit 64. FIG. 21 is a circuit diagram illustrating an example of an inverting section 63 of the sensor inverter 62. As illustrated in FIG. 21, the inverting section 63 includes two PMOS transistors P1, P2 and two NMOS transistors N1, N2 connected together in series. A p-bias voltage generated by a bias circuit is applied to the gate of the PMOS transistor P1. An n-bias voltage generated by the bias circuit is applied to the gate of the NMOS transistor N2. A voltage of a node1 is applied to the gates of the PMOS transistor P2 and the NMOS transistor N1.

The inverting section 63 is input with the p-bias voltage and the n-bias voltage, and the ON-resistances of the PMOS field effect transistors P1, P2 and the NMOS field effect transistors N1, N2 are changed in response to the bias voltages. Thus, in the inverting section 63, there is a change in the trans-conductance, changing according to the bias voltages when transitioning from L level to H level, and when transitioning from H level to L level.

A bias circuit provided in the sensor inverter 62 of the present exemplary embodiment, changes the generated bias voltages according to temperature.

Figure 22:
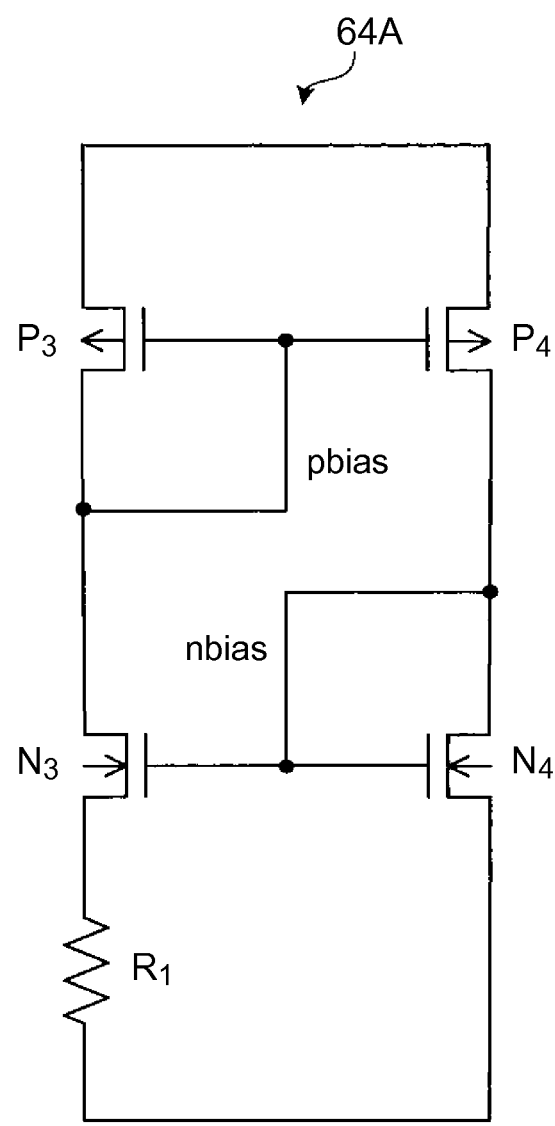
FIG. 22 is a circuit diagram of a bias circuit of a sensor inverter of an RC oscillator circuit of the third exemplary embodiment.

FIG. 22 is a circuit diagram illustrating a bias circuit of a sensor inverter 62 of the present exemplary embodiment. The bias circuit 64A illustrated in FIG. 22 includes a current mirror configured by two PMOS transistors P3, P4, a current mirror configured by two NMOS transistors N3, N4, and a resistor element R1.

The voltage applied to the gates of the PMOS transistor P3 and the PMOS transistor 4 in the bias circuit 64A is supplied as the p-bias voltage to the inverting section 63. The voltage applied to the gates of the NMOS transistor N3 and the NMOS transistor N4 in the bias circuit 64A is supplied as the n-bias voltage to the inverting section 63.

Figure 23:
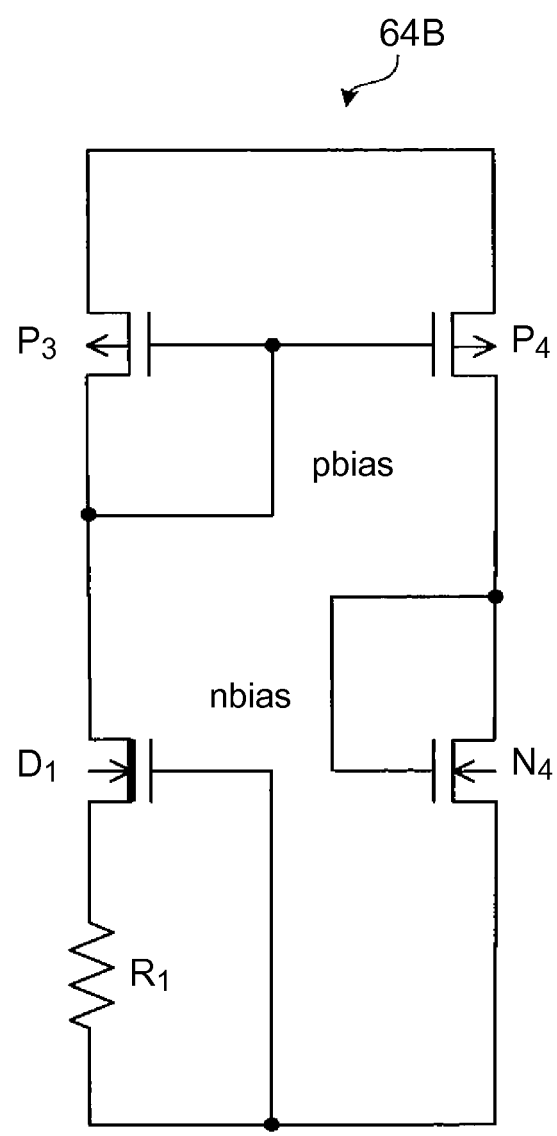
FIG. 23 is a circuit diagram of another example of a bias circuit of a sensor inverter of an RC oscillator circuit of the third exemplary embodiment.

FIG. 23 is a circuit diagram illustrating another example of a bias circuit of the sensor inverter 62 of the present exemplary embodiment. The bias circuit 64B illustrated in FIG. 23 includes a current mirror configured by two PMOS transistors P3, P4, one DMOS transistor D1, one NMOS transistor N4, and a resistor element R1.

A voltage of a node where the NMOS transistor N4 and the resistor element R1 are connected together is applied to the gate of the DMOS transistor D1. A voltage of a node where the PMOS transistor P4 and the NMOS transistor N4 are connected together is applied to the gate of the NMOS transistor N4.

The voltage applied to the gates of the PMOS transistor P3 and the PMOS transistor P4 of the bias circuit 64B is supplied as the p-bias voltage to the inverting section 63. The voltage applied to the gate of the NMOS transistor N4 of the bias circuit 64A is supplied as the n-bias voltage to the inverting section 63.

In the bias circuit 64A illustrated in FIG. 22 and the bias circuit 64B illustrated in FIG. 23, the bias voltages have temperature characteristics dependent on the temperature characteristics of the MOS transistors. Accordingly, the bias voltages (p-bias, n-bias) applied to the inverting section 63 change with temperature, thereby functioning as the sensor inverter 62. By employing resistors with temperature dependent characteristics for the resistor elements R1 of the bias circuit 64A and the bias circuit 64B imparts the bias circuit 64A and the bias circuit 64B with even greater temperature dependency characteristics.

Figure 24:
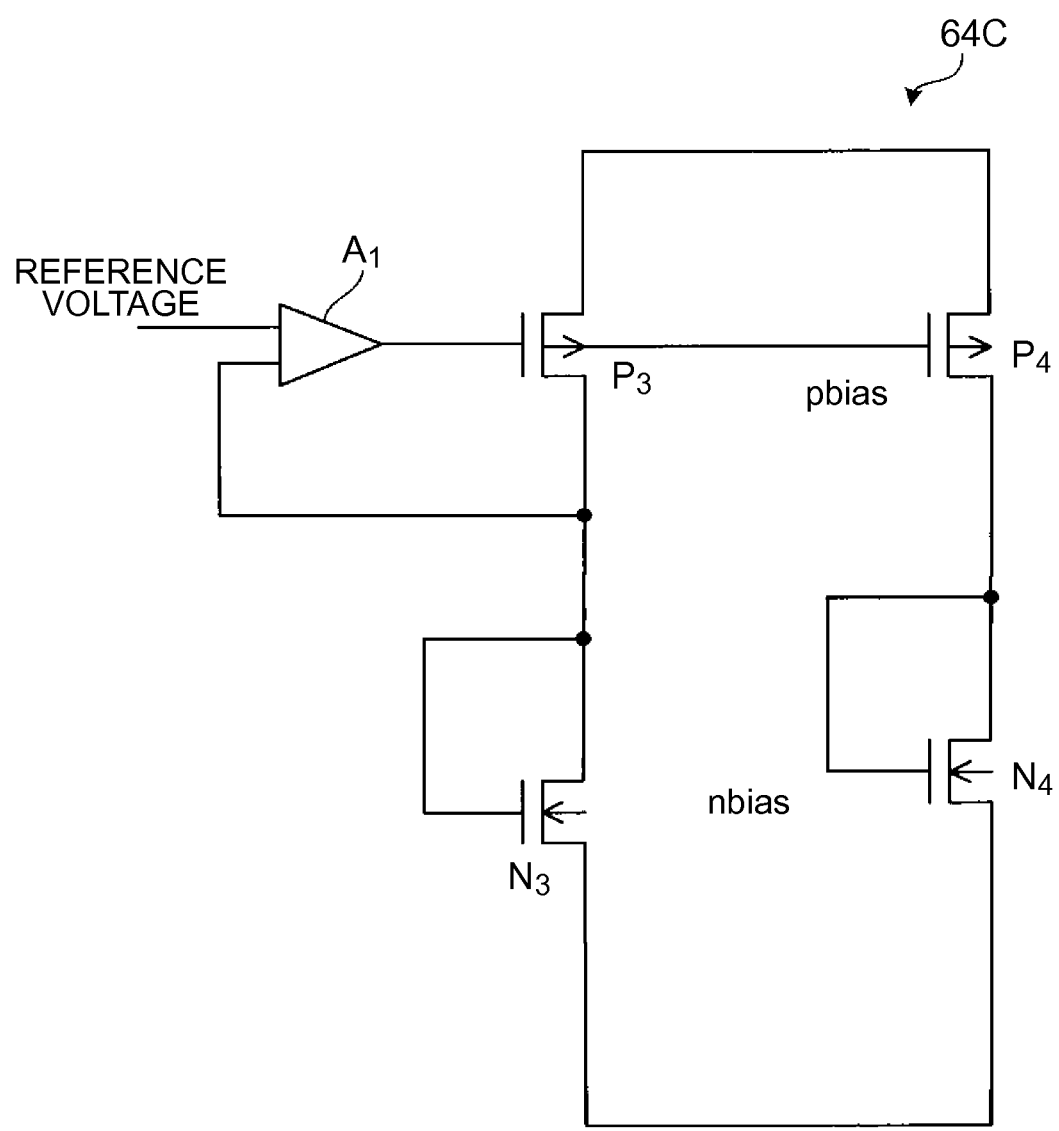
FIG. 24 is a circuit diagram of another example of a bias circuit of a sensor inverter of an RC oscillator circuit of the third exemplary embodiment.
Figure 25:
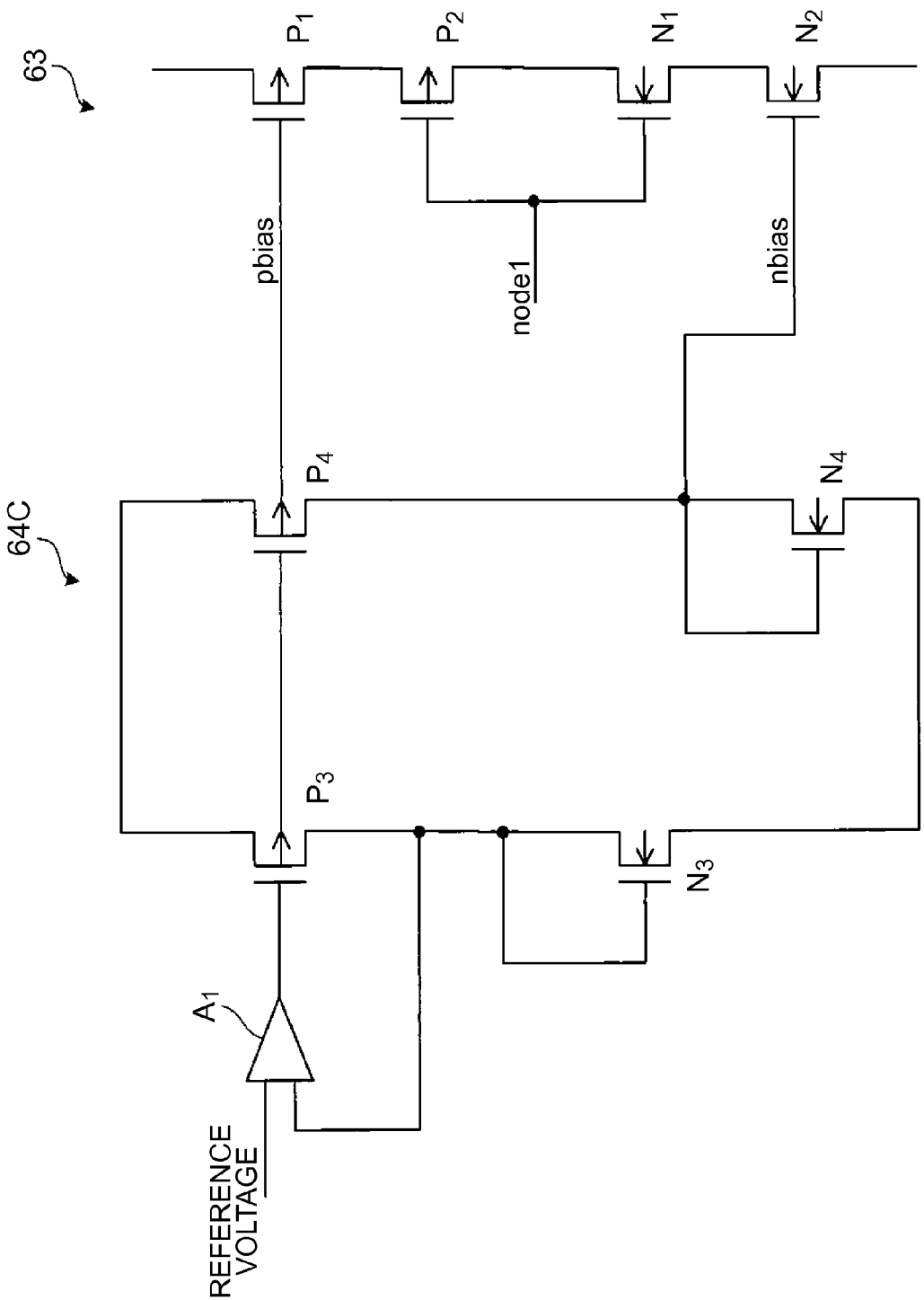
FIG. 25 is a circuit diagram by a sensor inverter employing the bias circuit of the third exemplary embodiment illustrated in FIG. 24.

FIG. 24 is a circuit diagram illustrating another example of a bias circuit of the sensor inverter 62 of the present exemplary embodiment. FIG. 25 is a circuit diagram illustrating the sensor inverter 62 including the bias circuit 64C illustrated in FIG. 24 and the inverting section 63.

The bias circuit 64C illustrated in FIG. 24 includes two PMOS transistors P3, P4, two NMOS transistors N3, N4, and an amplifier A1.

The amplifier A1 is input with a reference voltage and a voltage of a node where the PMOS transistor P3 and the NMOS transistor N3 are connected together. The output of the amplifier A1 is connected to the gates of the PMOS transistors P3, P4. A voltage of a node where the PMOS transistor P3 and the NMOS transistor N3 are connected, is applied to the gate of the NMOS transistor N3. A voltage of a node where the PMOS transistor P4 and the NMOS transistor N4 are connected, is applied to the gate of the NMOS transistor N4.

As illustrated in FIG. 25, the voltage applied to the gate of the PMOS transistor P4 of the bias circuit 64 is supplied as the p-bias voltage to the gate of the PMOS transistor P1 of the inverting section 63. Further, the voltage applied to the gate of the NMOS transistor N4 of the bias circuit 64 is supplied as the n-bias voltage to the gate of the NMOS transistor N2 of the inverting section 63.

In the bias circuit 64 illustrated in FIG. 24, the temperature-voltage characteristics (temperature dependency characteristics of voltage) of the MOS transistors can be converted to temperature-current characteristics (temperature dependency characteristics of current).

Note that the reference voltage of the amplifier A1 preferably employs a voltage generated by a band-gap regulator. Since the band-gap regulator also has temperature dependency characteristics, the temperature characteristics of the sensor inverter 62 exhibit greater dependency on temperature, enabling high precision measurement to be performed.

Further, the NMOS transistor N3 may be configured by a bipolar transistor in place of a MOS resistor. In such cases, since a collector current changes depending on the temperature, the temperature dependency characteristics of the sensor inverter 62 become more significant, enabling high precision measurement to be performed.

In the present exemplary embodiment, the sensor inverter 62 that charges the capacitor 24 and the capacitor 26 has temperature characteristics by the bias circuit 64 (64A, 64B, 64C). For example, when the sensor inverter 62 having positive temperature dependency characteristics is operated at a low temperature, the oscillation frequency (thermistor oscillation frequency: 1/tRT) becomes lower due to current decreasing. However, when the sensor invertor 62 is operated at high temperature, the oscillation frequency (thermistor oscillation frequency: 1/tRT) becomes higher due to current increasing.

Accordingly, temperature measurement can be performed by the semiconductor device 10 that employs the RC oscillator circuit 12' including the sensor inverter 62 in place of the thermistor 20. Since the sensor inverter 62 can be incorporated internally to the semiconductor device 10 (within an LSI chip), the whole of the RC oscillator circuit 12' can be provided internally to the semiconductor device 10.

In the RC oscillator circuit 12', since there is no longer a need for the thermistor 20 to be attached externally, the number of components may be reduced, and the circuit board design may be simplified. Moreover, manufacturing costs for the RC oscillator circuit 12' may be reduced.

Note that, in the RC oscillator circuit 12'n there is no particular limitation to the configuration described above as long as the bias circuit 64 has temperature dependency characteristics. Moreover, the inverting section 63 of the bias circuit 64 may be configured similarly to an inverting section (not illustrated in the drawings) of the inverter 60.

As described above, in the semiconductor device 10 of the present exemplary embodiment, the faster out of the reference oscillation or the thermistor oscillation is determined, and from the result of measurement performed using the faster out of the reference oscillation or the thermistor oscillation as a reference, the frequency ratio is computed, and the temperature is acquired by referring to the table of frequency ratio and temperature.

The semiconductor device 10 of each of the exemplary embodiments described above performs measurement using the faster out of the reference oscillation or the thermistor oscillation as a reference, thereby enabling high precision measurement to be performed over a wide range without overflow occurring.

Note that, in each of the exemplary embodiments described above, cases in which the semiconductor device 10 measures temperature with a thermistor sensor of the RC oscillator circuit 12, have been described. However, there is no limitation thereto. Application may be made to semiconductor devices that perform measurement with an RC oscillator circuit employing various different types of sensor, such as humidity sensors or pressure sensors. For example, an RC oscillator circuit may be employed that uses a reference resistor element and a capacitor element (sensor capacitor) with humidity characteristics.

In each of the exemplary embodiments described above, the semiconductor device 10 only includes one RC oscillator circuit 12 (12'), however, plural RC oscillator circuits 12 (12') may be provided. For example, an RC oscillator circuit 12 (12') for measuring temperature and an RC oscillator circuit 12 (12') for measuring humidity, may be provided.

In each of the exemplary embodiments described above, cases in which an RC oscillator employing a reference oscillator with respect to oscillation of a thermistor (sensor) oscillation, have been described. However it is sufficient to employ a reference oscillation that hardly changes (has low dependency) with respect to temperature or environment, or an oscillator that behaves completely differently to the thermistor (sensor) oscillation. There is no limitation of the reference oscillation to a RC oscillation, and for example a CI oscillation or a clock oscillation may be employed.

In the first exemplary embodiment and the second exemplary embodiment, the reference resistor 22 is configured by a variable resistor. However, there is no limitation thereto, and a resistor element with a fixed resistance value may be employed.

Moreover, configurations and operations of the electronic device 1, the semiconductor device 10 and the RC oscillator circuit 12 described in other exemplary embodiments described above are merely examples thereof, and may be modified according to circumstances within a range not departing from the spirit of the present invention.

What is claimed is:

1. A semiconductor device comprising:
a first counter that performs a count operation based on a signal of a first frequency;
a second counter that performs a count operation based on a signal of a second frequency; and
a control section that determines a higher frequency out of the first frequency or the second frequency based on a count value of the first counter and a count value of the second counter, measures the other frequency and computes a frequency ratio by using the higher frequency as a reference, and acquires a measurement value by referring to a specific table expressing correspondence relationships between the frequency ratio and the measurement values, wherein the specific table includes a first region stored with ratios of the second frequency with respect to the first frequency, and a second region stored with ratios of the first frequency with respect to the second frequency, and frequency ratios are stored in the first region for cases in which the first frequency is lower than a value of a sum of the second frequency plus a specific permissible value, and frequency ratios are stored in the second region for cases in which the first frequency is greater than a value of the second frequency from which a specific permissible value has been subtracted.

2. The semiconductor device of claim 1, wherein the control section computes a frequency ratio according to the specific table, either based on a ratio of a first count value, the first count value counted by one counter that performs the count operation based on the signal that has the higher frequency, with respect to a second count value counted by the other counter, or based on a ratio of the second count value with respect to the first count value.

3. The semiconductor device of claim 1, wherein the control section refers to the first region when the first frequency is higher, and refers to the second region when the second frequency is higher.

4. The semiconductor device of claim 1, wherein,
the first counter or the second counter transmits a specific notification to the control section, and
the control section, on receipt of the notification, determines which out of the first counter or the second counter has made the notification, and stops the count of the counter that has not transmitted the notification.

5. The semiconductor device of claim 1, wherein the first frequency is a frequency of oscillation based on a reference resistor element and a capacitor element, and the second frequency is a frequency of oscillation based on a sensor element that changes its resistance value depending on environment and the capacitor element.

6. The semiconductor device of claim 1, further comprising:
a first capacitor element with one end connected to ground;
a reference resistor element with one end connected to the other end of the first capacitor element;
a second capacitor element with one end connected to the other end of the first capacitor element;
a first inverter with an input side connected to the other end of the first capacitor element;
a second inverter with an input side connected to an output side of the first inverter;
a third inverter with an input side connected to an output side of the second inverter, and with an output side connected to the other end of the reference resistor element;
a fourth inverter with an input side connected to the output side of the first inverter, and with an output side connected to the other end of the second capacitor element; and
a sensor inverter with an input side connected to the output side of the second inverter and an output side connected to the other end of the first capacitor element, and whose output changes depending on environment,
wherein the first frequency is a frequency of an oscillation based on the reference resistor element, the first capacitor element and the second capacitor element, and the second frequency is a frequency of an oscillation based on the sensor inverter, the first capacitor element and the second capacitor element.

7. The semiconductor device of claim 6, wherein the sensor inverter includes a bias circuit that generates a bias voltage that changes depending on environment, and an inverter that is applied with the bias voltage supplied from the bias circuit.

8. A semiconductor device comprising:
a first counter that performs a count operation based on a clock signal;
a second counter that performs a count operation based on a signal of a first frequency and a signal of a second frequency; and
a control section that determines a higher frequency out of the first frequency or the second frequency based on a count value of the first counter, a count value of the second counter that counts based on the signal of the first frequency, and a count value of the second counter that counts based on the signal of the second frequency, computes a frequency ratio by measuring the clock signal using the higher frequency as a reference, based on a measurement result of measuring the lower frequency using the clock signal as a reference, and acquires a measurement value by referring to a specific table expressing correspondence relationships between the frequency ratio and the measurement values.

9. The semiconductor device of claim 8, wherein the control section computes a frequency ratio expressing a ratio of the second frequency with respect to the first frequency when the first frequency is the higher frequency, and computes a frequency ratio expressing a ratio of the first frequency with respect to the second frequency when the second frequency is the higher frequency.

10. The semiconductor device of claim 8, wherein the first frequency is a frequency of oscillation based on a reference resistor element and a capacitor element, and the second frequency is a frequency of oscillation based on a sensor element that changes its resistance value depending on environment and the capacitor element.

11. The semiconductor device of claim 8, further comprising:
a first capacitor element with one end connected to ground;
a reference resistor element with one end connected to the other end of the first capacitor element;
a second capacitor element with one end connected to the other end of the first capacitor element;
a first inverter with an input side connected to the other end of the first capacitor element;
a second inverter with an input side connected to an output side of the first inverter;
a third inverter with an input side connected to an output side of the second inverter, and with an output side connected to the other end of the reference resistor element;
a fourth inverter with an input side connected to the output side of the first inverter, and with an output side connected to the other end of the second capacitor element; and
a sensor inverter with an input side connected to the output side of the second inverter and an output side connected to the other end of the first capacitor element, and whose output changes depending on its environment,
wherein the first frequency is a frequency of an oscillation based on the reference resistor element, the first capacitor element and the second capacitor element, and the second frequency is a frequency of an oscillation based on the sensor inverter, the first capacitor element and the second capacitor element.

12. The semiconductor device of claim 11, wherein the sensor inverter includes a bias circuit that generates a bias voltage that changes depending on environment, and an inverter that is applied with the bias voltage supplied from the bias circuit.

13. A measurement method performed by a semiconductor device that includes a first counter that performs a count operation based on a signal of a first frequency and a second counter that performs a count operation based on a signal of a second frequency, the measurement method comprising:
   determining a higher frequency out of the first frequency or the second frequency based on a count value of the first counter and a count value of the second counter, measuring the other frequency with the higher frequency as a reference, and computing a frequency ratio, and
   acquiring a measurement value by referring to a specific table expressing correspondence relationships between the frequency ratio and the measurement values
   wherein the specific table includes a first region stored with ratios of the second frequency with respect to the first frequency, and a second region stored with ratios of the first frequency with respect to the second frequency, and
   frequency ratios are stored in the first region for cases in which the first frequency is lower than a value of a sum of the second frequency plus a specific permissible value, and frequency ratios are stored in the second region for cases in which the first frequency is greater than a value of the second frequency from which a specific permissible value has been subtracted.

14. A measurement method performed by a semiconductor device that includes a first counter that performs a count operation based on a clock signal, a second counter that performs a count operation based on a signal of a first frequency and a signal of a second frequency, the measurement method comprising:
   determining a higher frequency out of the first frequency or the second frequency based on a count value of the first counter, a count value of the second counter counted based on the signal of the first frequency, and a count value of the second counter counted based on the signal of the second frequency,
   computing a frequency ratio by measuring the clock signal using the higher frequency as a reference, based on a measurement result of measuring the lower frequency using the clock signal as a reference, and
   acquiring a measurement value by referring to a specific table expressing correspondence relationships between the frequency ratio and the measurement values.

* * * * *